United States Patent
Bae et al.

(10) Patent No.: US 11,177,320 B2
(45) Date of Patent: Nov. 16, 2021

(54) VARIABLE RESISTANCE MEMORY DEVICE AND METHOD OF FABRICATING THE SAME

(71) Applicant: SAMSUNG ELECTRONICS CO., LTD., Suwon-si (KR)

(72) Inventors: Byeongju Bae, Hwaseong-si (KR); Duckhee Lee, Busan (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 41 days.

(21) Appl. No.: 16/561,675

(22) Filed: Sep. 5, 2019

(65) Prior Publication Data

US 2020/0219934 A1    Jul. 9, 2020

(30) Foreign Application Priority Data

Jan. 8, 2019    (KR) .................. 10-2019-0002372

(51) Int. Cl.
| | | |
|---|---|---|
| H01L 27/24 | (2006.01) | |
| H01L 23/528 | (2006.01) | |
| H01L 45/00 | (2006.01) | |

(52) U.S. Cl.
CPC ........ *H01L 27/2463* (2013.01); *H01L 23/528* (2013.01); *H01L 27/2427* (2013.01); *H01L 45/06* (2013.01); *H01L 45/08* (2013.01); *H01L 45/1233* (2013.01); *H01L 45/1253* (2013.01); *H01L 45/143* (2013.01); *H01L 45/144* (2013.01); *H01L 45/146* (2013.01); *H01L 45/147* (2013.01); *H01L 45/1683* (2013.01)

(58) Field of Classification Search
None
See application file for complete search history.

(56) References Cited

U.S. PATENT DOCUMENTS

| | | | |
|---|---|---|---|
| 8,509,415 B2 | 8/2013 | Lawson et al. | |
| 8,703,573 B2 | 4/2014 | Oh et al. | |
| 8,822,969 B2 | 9/2014 | Hwang | |
| 9,029,828 B2* | 5/2015 | Oh | H01L 45/126 257/4 |
| 9,472,554 B2 | 10/2016 | Hargrove et al. | |
| 9,530,849 B2 | 12/2016 | Oh et al. | |
| 2008/0283812 A1* | 11/2008 | Liu | H01L 45/1293 257/2 |
| 2010/0181549 A1 | 7/2010 | Kim et al. | |
| 2011/0073826 A1 | 3/2011 | Lee et al. | |

(Continued)

FOREIGN PATENT DOCUMENTS

| | | |
|---|---|---|
| KR | 10-1077158 B1 | 10/2011 |
| KR | 10-2013-0112529 A | 10/2013 |

*Primary Examiner* — Ali Naraghi
(74) *Attorney, Agent, or Firm* — Sughrue Mion, PLLC

(57) ABSTRACT

Disclosed are variable resistance memory devices and methods of fabricating the same. The variable resistance memory device may include: a plurality of memory cells, each comprising a variable resistance pattern and a switching pattern; a plurality of conductive lines to which the memory cell is connected; a bottom electrode connecting at least one of the conductive lines to the variable resistance pattern; and a spacer pattern formed on the bottom electrode to be in contact with the variable resistance pattern. The spacer pattern includes a dielectric material doped with an impurity.

16 Claims, 22 Drawing Sheets

(56) References Cited

U.S. PATENT DOCUMENTS

| | | | | |
|---|---|---|---|---|
| 2013/0299987 A1* | 11/2013 | Lin | .................. | H01L 23/481 |
| | | | | 257/741 |
| 2017/0110577 A1* | 4/2017 | Wang | .................. | H01L 29/7848 |
| 2019/0181341 A1* | 6/2019 | Choi | .................. | H01L 45/1253 |

* cited by examiner

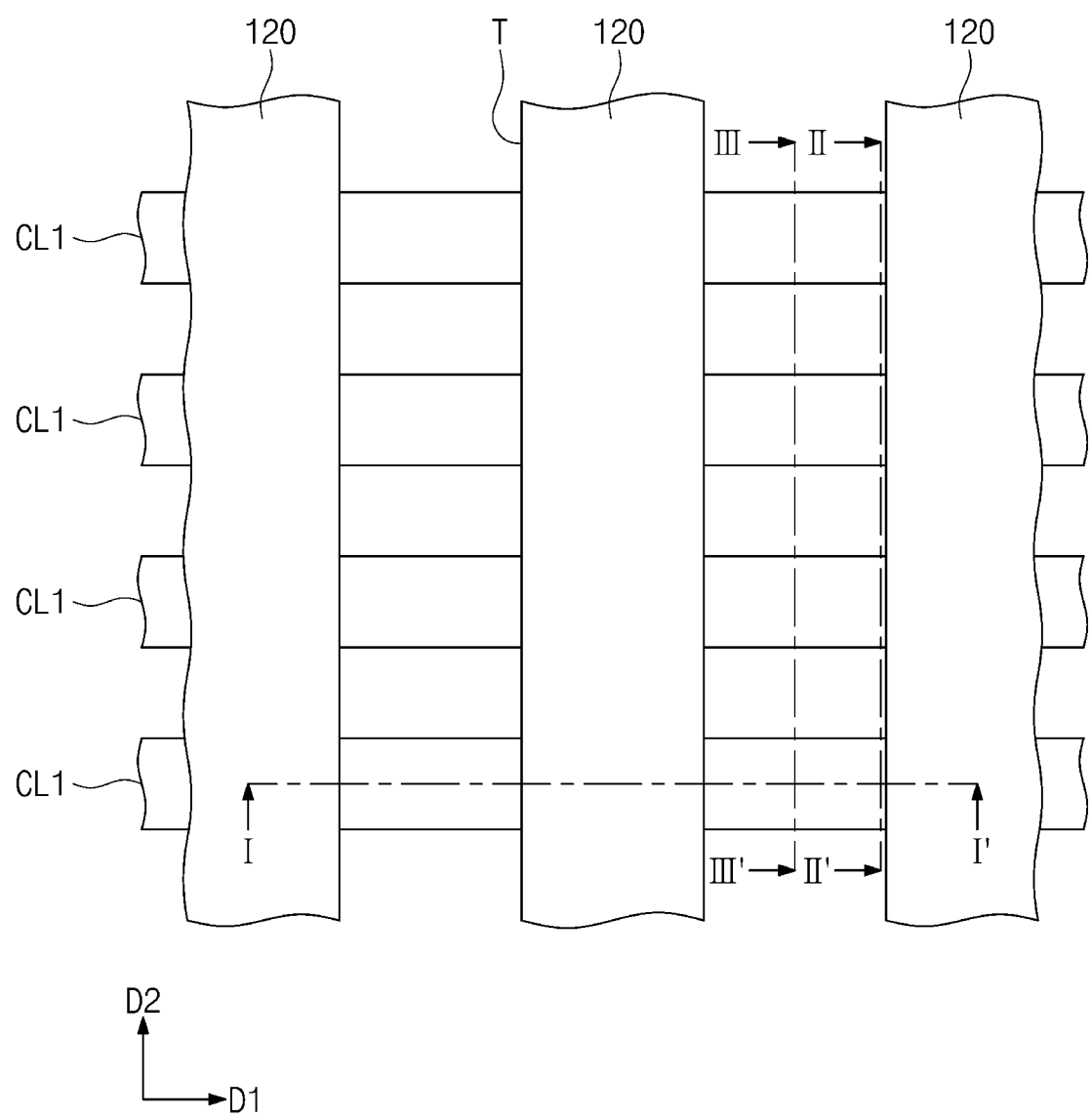

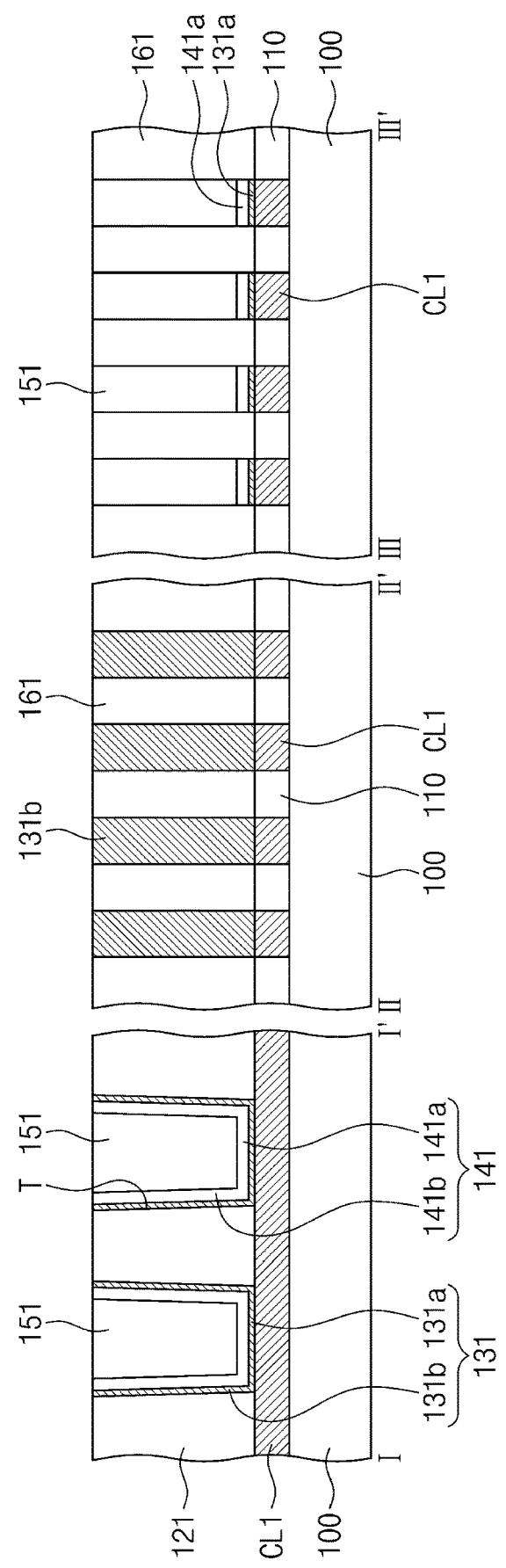

VARIABLE RESISTANCE MEMORY DEVICE AND METHOD OF FABRICATING THE SAME

CROSS-REFERENCE TO THE RELATED APPLICATION

This application claims priority from Korean Patent Application No. 10-2019-0002372 filed on Jan. 8, 2019 in the Korean Intellectual Property Office, the disclosure of which is incorporated herein by reference in its entirety.

BACKGROUND

Example embodiments of the inventive concepts relate to a semiconductor memory device and a method of fabricating the same, and more particularly, to a variable resistance memory device and a method of fabricating the same.

According to demand for memory devices having a high capacity and low power consumption, research is being conducted on next-generation memory devices that are nonvolatile and do not require a refresh operation. The next-generation memory devices are required to have high integration characteristics of DRAM (dynamic random access memory), nonvolatile characteristics of flash memory, and/or high speed of SRAM (static RAM).

Next generation semiconductor memory devices, for example, ferroelectric random access memory (FRAM), magnetic random access memory (MRAM) and phase change random access memory (PRAM), are recently being developed to meet the trend of high performance and low power consumption of the semiconductor memory device. The next generation semiconductor memory devices are formed of materials having characteristics that their resistance becomes different depending on an applied current or voltage and their resistance is maintained even when the current or voltage supply is interrupted.

SUMMARY

Example embodiments of the inventive concepts provide a variable resistance memory device and a method of fabricating the same, which method is able to improve electrical characteristics of the variable resistance memory device and to achieve process simplification.

Objects of the inventive concepts are not limited to the mentioned above, and other objects which have not been mentioned above will be clearly understood to those skilled in the art from the following description.

According to example embodiments, there is provided a variable resistance memory device which may include: a plurality of memory cells, each comprising a variable resistance pattern and a switching pattern; a plurality of conductive lines to which the memory cell is connected; a bottom electrode connecting at least one of the conductive lines to the variable resistance pattern; and a spacer pattern formed on the bottom electrode to be in contact with the variable resistance pattern. The spacer pattern may include a dielectric material doped with an impurity.

According to example embodiments, there is provide a variable resistance memory device which may include: a first conductive line extending in a first direction; a mold dielectric pattern formed on the first conductive line; a second conductive line formed on the mold dielectric pattern and extending in a second direction different from the first direction; a bottom electrode formed in the mold dielectric pattern, the bottom electrode including a bottom portion connected to the first conductive line and a sidewall portion vertically protruding from the bottom portion; a buried dielectric pattern covering the bottom portion and the sidewall portion of the bottom electrode; a spacer pattern formed between the buried dielectric pattern and the bottom electrode, the spacer pattern including a dielectric material doped with an impurity; and a variable resistance pattern formed between the bottom electrode and the second conductive line, the variable resistance pattern being in contact with the sidewall portion of the bottom electrode.

According to example embodiments, there is provided a method of fabricating a variable resistance memory device which may include: forming, on a substrate, a first conductive line extending in a first direction; forming a trench in a mold dielectric layer covering the first conductive line; sequentially forming a preliminary electrode pattern and a preliminary spacer pattern in the trench; forming a buried dielectric pattern in the trench in which the preliminary electrode pattern and the preliminary spacer pattern are formed; performing a first etching process to recess a top surface of the preliminary electrode pattern and a top surface of the preliminary spacer pattern; performing a second etching process on the mold dielectric layer and the buried dielectric pattern to form an expanded recess region between the mold dielectric layer and the buried dielectric pattern; and forming a variable resistance pattern in the expanded recess region.

BRIEF DESCRIPTION OF THE DRAWINGS

FIGS. 10A, 11A, and 12A illustrate plan views showing a method of fabricating a variable resistance memory device according to example embodiments.

FIGS. 10B, 11B, and 12B illustrate cross-sectional views taken along lines I-I', II-II', and III-III' of FIGS. 10A, 11A, and 12A, showing a method of fabricating a variable resistance memory device according to example embodiments.

DETAILED DESCRIPTION OF EXAMPLE EMBODIMENTS

The following will now describe in detail variable resistance memory devices and methods of fabricating the same according to example embodiments in conjunction with the accompanying drawings.

Figure 1:
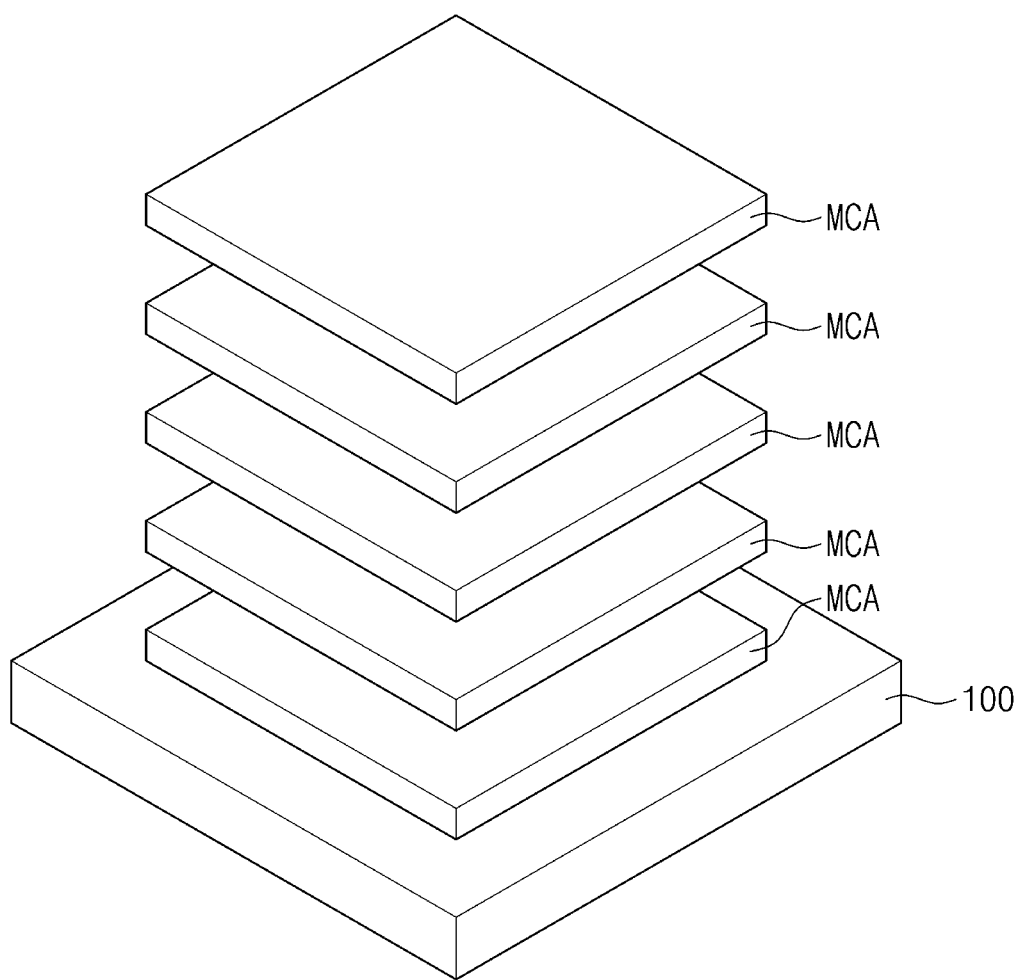
FIG. 1 illustrates a conceptual view showing a variable resistance memory device according to example embodiments.

FIG. 1 illustrates a conceptual view showing a variable resistance memory device according to example embodiments.

Referring to FIG. 1, a variable resistance memory device according to example embodiments may include a plurality of memory cell stacks MCA that are sequentially stacked on a substrate 100. Each of the memory cell stacks MCA may include a plurality of variable resistance memory cells that are arranged two-dimensionally. The variable resistance memory device may include a plurality of conductive lines that are disposed between the memory cell stacks MCA to write, read, and erase the memory cells. FIG. 1 shows five memory cell stacks MCA, but the inventive concepts are not limited thereto.

Figure 2:
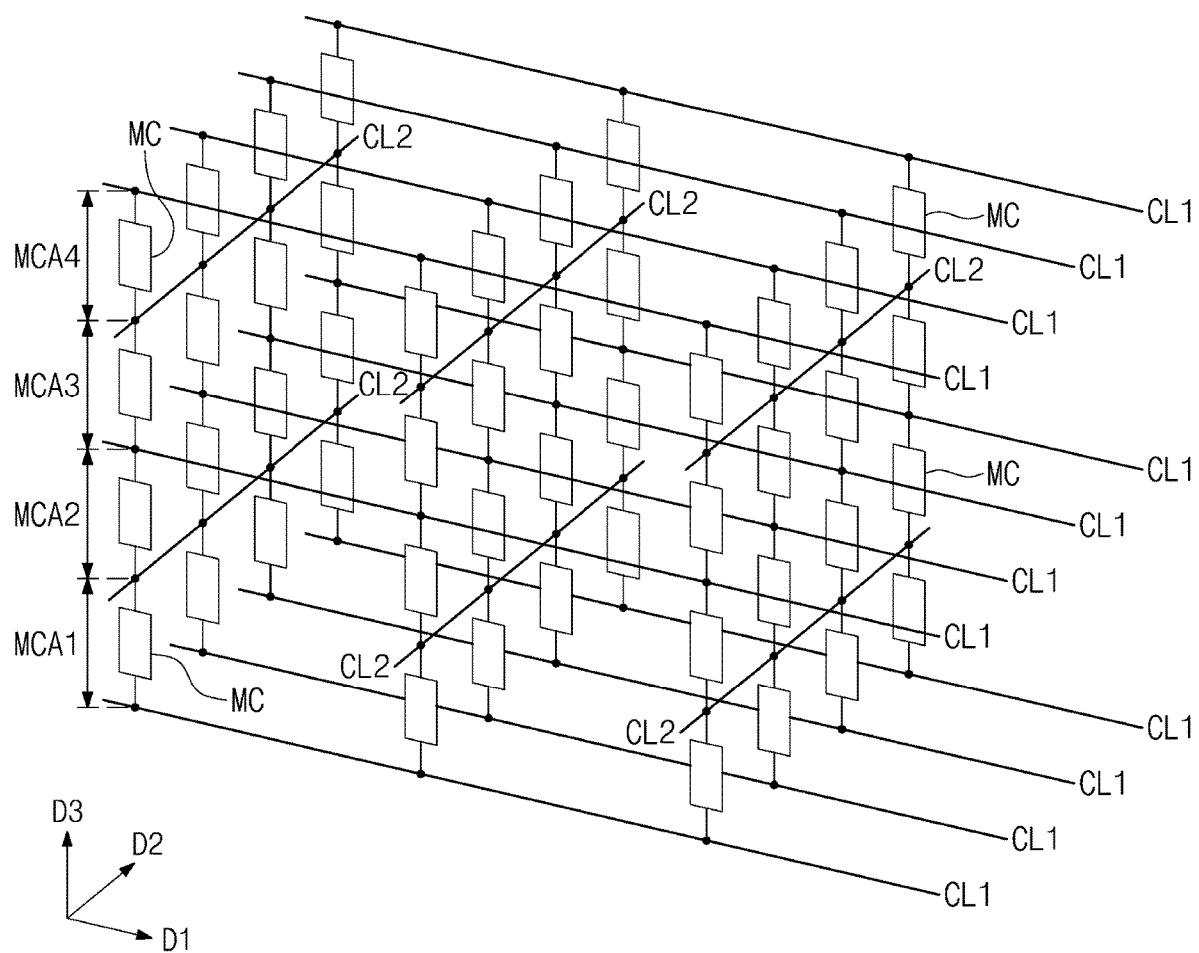
FIG. 2 illustrates a simplified circuit diagram showing a cell array block of a variable resistance memory device according to example embodiments.

FIG. 2 illustrates a simplified circuit diagram showing a cell array block of a variable resistance memory device according to example embodiments.

Referring to FIG. 2, first to fourth memory cell stacks MCA1 to MCA4 may be stacked along a third direction D3 on a plane that elongates along first and second directions D1 and D2 intersecting each other.

Each of the first to fourth memory cell stacks MCA1 to MCA4 may include first conductive lines CL1, second conductive lines CL2, and memory cells MC at corresponding intersections of the first and second conductive lines CL1 and CL2. For example, in the first to fourth memory cell stacks MCA1 to MCA4, the memory cells MC may be two-dimensionally arranged along the first and second directions D1 and D2.

The memory cells MC neighboring in the third direction D3 may share either the first conductive lines CL1 or the second conductive lines CL2 disposed therebetween.

Figure 3:
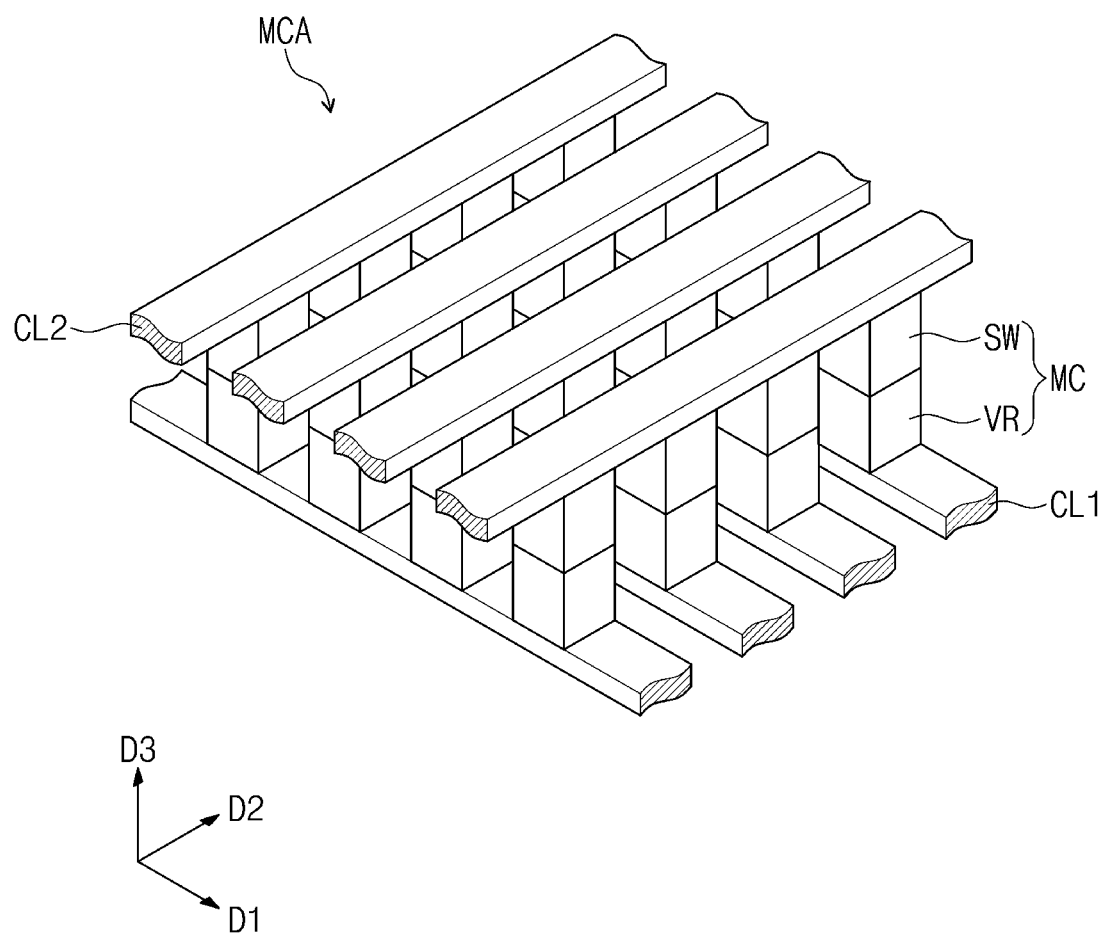
FIG. 3 illustrates a perspective view showing a single memory cell stack.

FIG. 3 illustrates a perspective view showing a single memory cell stack.

Referring to FIG. 3, the memory cells MC may be disposed at corresponding intersections of the first conductive lines CL1 and the second conductive lines CL2.

Each of the memory cells MC may include a switching element SW and a variable resistance structure VR. The memory cells MC may be spaced apart from one another along the first and second directions D1 and D2.

The variable resistance structures VR may be correspondingly disposed at intersections of the first conductive lines CL1 and the second conductive lines CL2, and the switching elements SW may be correspondingly disposed between the variable resistance structures VR and the second conductive lines CL2.

Although FIG. 3 shows that the switching element SW is disposed between the variable resistance structure VR and the second conductive line CL2, the switching element SW may be disposed between the variable resistance structure VR and the first conductive line CL1.

Figure 4:
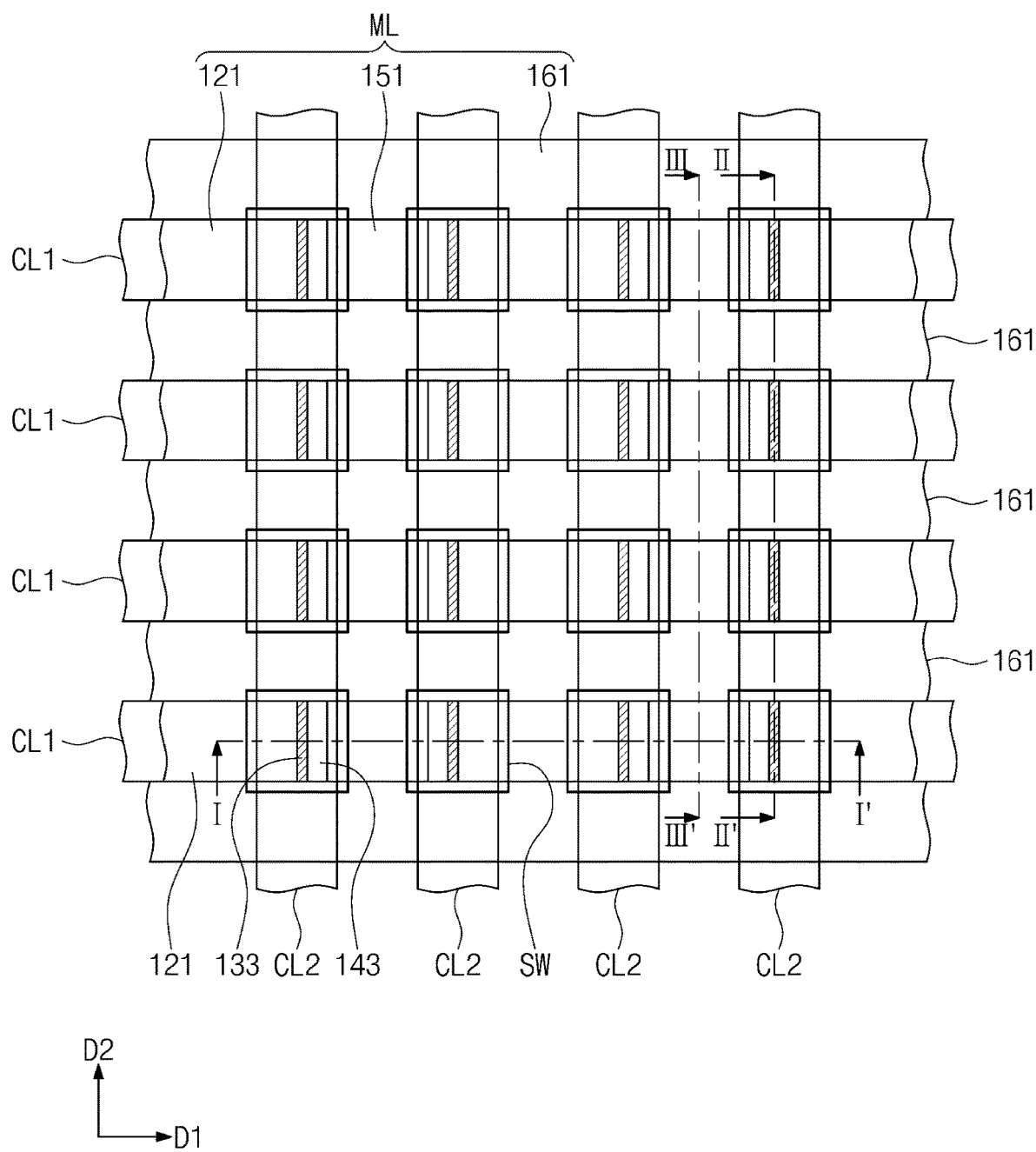
FIG. 4 illustrates a plan view showing a variable resistance memory device according to example embodiments.
Figure 5:
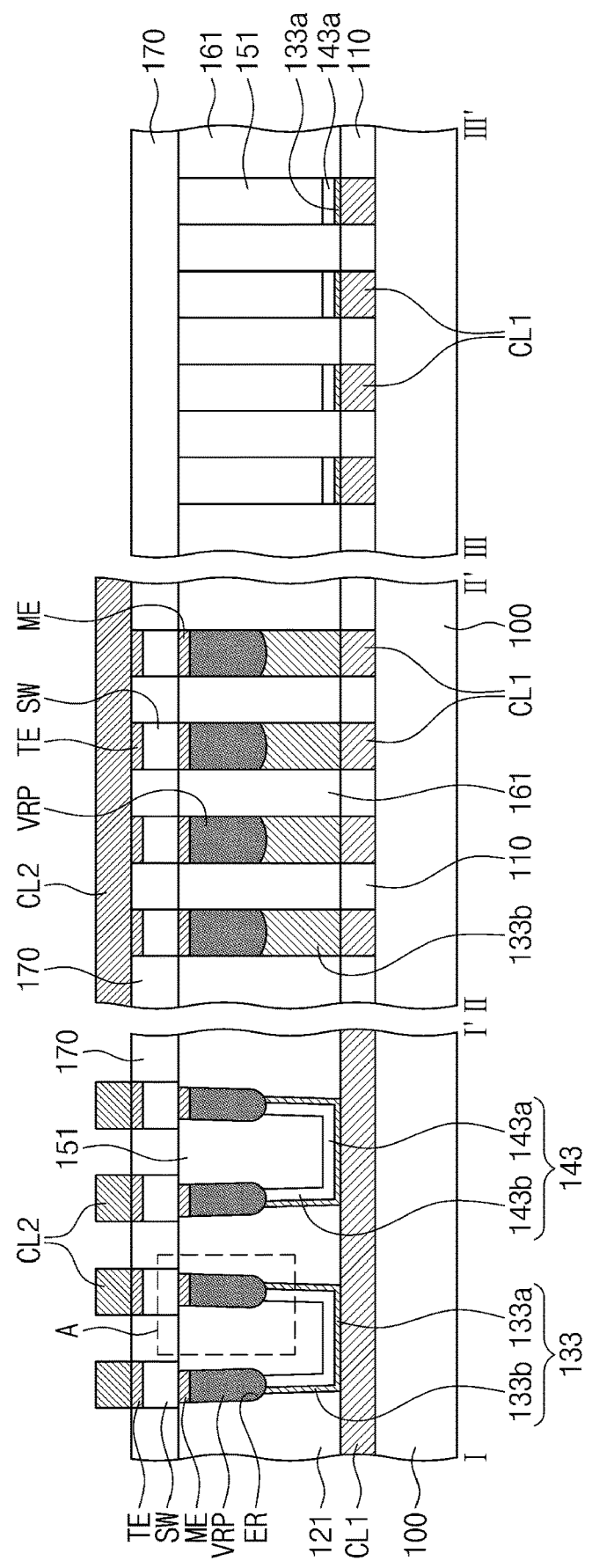
FIG. 5 illustrates a cross-sectional view taken along lines I-I', II-II', and III-III' of FIG. 4, showing a variable resistance memory device according to example embodiments.
Figure 6A:
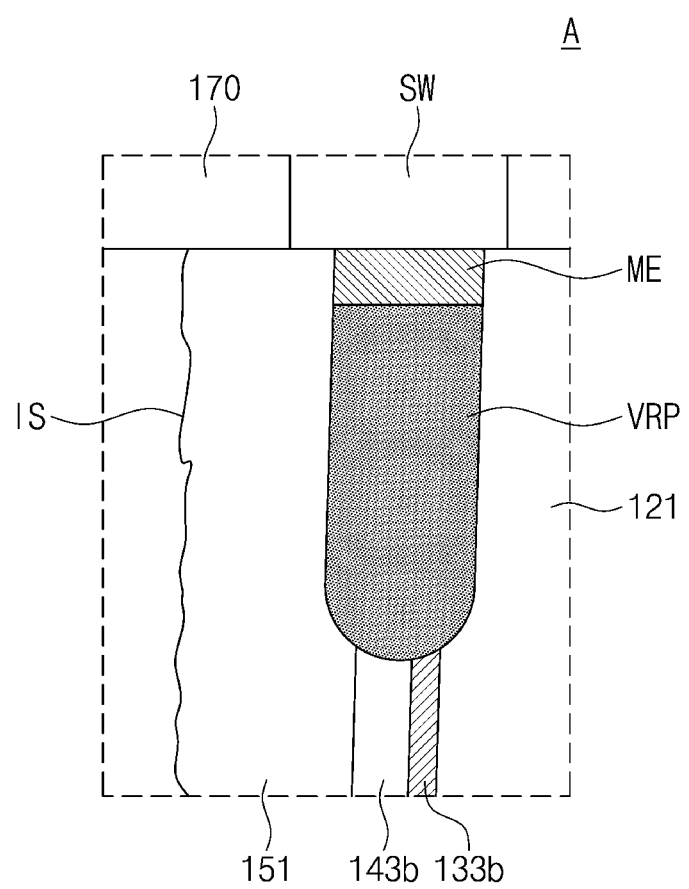
FIGS. 6A, 6B, and 6C illustrate enlarged views showing section A of FIG. 5.
Figure 6B:
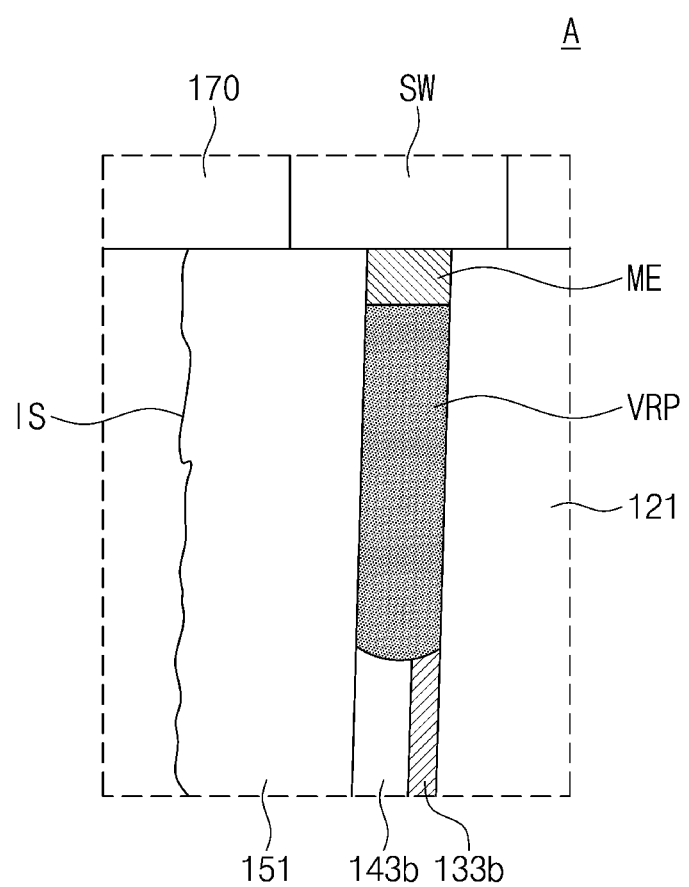
Figure 6C:
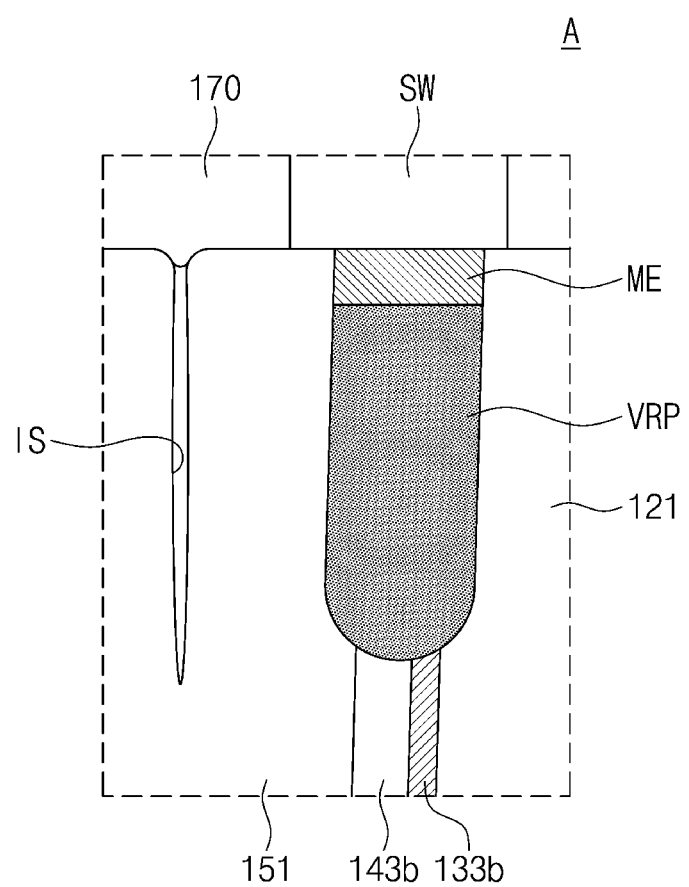

FIG. 4 illustrates a plan view showing a variable resistance memory device according to example embodiments. FIG. 5 illustrates a cross-sectional view taken along lines I-I', II-II', and III-III' of FIG. 4, showing a variable resistance memory device according to example embodiments. FIGS. 6A, 6B, and 6C illustrate enlarged views showing section A of FIG. 5, according to example embodiments.

Referring to FIGS. 4 and 5, a substrate 100 is provided with first conductive lines CL1 thereon. A lower interlayer dielectric layer 110 encompasses the first conductive lines CL1 on the substrate 100.

The substrate 100 may be a semiconductor substrate formed of one or more of silicon, germanium, and silicon-germanium. The substrate 100 may be a bulk silicon substrate, a silicon-on-insulator (SOI) substrate, a germanium substrate, a germanium-on-insulator (GOI) substrate, a silicon-germanium substrate, or an epitaxial layer substrate obtained by performing selective epitaxial growth (SEG).

The first conductive lines CL1 may extend in a first direction D1 and be spaced apart from each other in a second direction D2. The first and second directions D1 and D2 may intersect each other and be parallel to a top surface of the substrate 100. The lower interlayer dielectric layer 110 may be provided to encompass the first conductive lines CL1 and may expose top surfaces of the first conductive lines CL1.

The first conductive lines CL1 may include one or more of metal (e.g., copper, tungsten, or aluminum) and metal nitride (e.g., tantalum nitride, titanium nitride, or tungsten nitride). The lower interlayer dielectric layer 110 may include, for example, one or more of silicon oxide, silicon nitride, and silicon oxynitride.

The second conductive lines CL2 may be provided to cross over the first conductive lines CL1. The second conductive lines CL2 may extend in the second direction D2 and be spaced apart from one another in the first direction D1. The second conductive lines CL2 may be spaced apart from the first conductive lines CL1 in a perpendicular direction to the top surface of the substrate 100. The second conductive lines CL2 may include one or more of metal (e.g., copper, tungsten, or aluminum) and metal nitride (e.g., tantalum nitride, titanium nitride, or tungsten nitride).

As discussed above, memory cells (see MC of FIG. 3) may be disposed at intersections of the first conductive lines CL1 and the second conductive lines CL2. Each of the memory cells (see MC of FIG. 3) may include a variable resistance pattern VRP and a switching element SW. Each of the memory cells may include a middle electrode ME between the variable resistance pattern VRP and the switching element SW.

The variable resistance pattern VRP may be provided between the switching element SW and the first conductive lines CL1. Alternatively, the variable resistance pattern VRP may be provided between the switching element SW and the second conductive lines CL2.

The variable resistance patterns VRP may be disposed in mold structure ML between the switching element SW and the first conductive lines CL1. The mold structure ML may include a mold dielectric pattern 121, a first buried dielectric pattern 151, and a second buried dielectric pattern 161. The mold dielectric pattern 121 and the first buried dielectric pattern 151 may be alternatively disposed along the first direction D1 on each of the first conductive lines CL1. The second buried dielectric pattern 161 may extend in the first direction D1 between the first conductive lines CL1. In certain embodiments, the mold dielectric pattern 121 and the first and second buried dielectric patterns 151 and 161 may include the same dielectric material. For example, the mold dielectric pattern 121 and the first and second buried dielectric patterns 151 and 161 may include silicon nitride or silicon oxynitride.

The mold structure ML may provide recess regions ER that are arranged two-dimensionally spaced apart from one another along the first and second directions D1 and D2. Each of the recess regions ER may be defined by the mold dielectric pattern 121 and the first and second buried dielectric patterns 151 and 161.

The variable resistance patterns VRP may be formed in the recess regions ER. In an example embodiment, the variable resistance patterns VRP may be disposed at corresponding intersections of the first conductive lines CL1 and the second conductive lines CL2, thereby constituting a two-dimensional arrangement. In another example embodiment, the variable resistance patterns VRP may have a plurality of linear shapes that extend along the first direction D1 or the second direction D2.

The variable resistance patterns VRP may be formed of at least one of materials having physical properties capable of storing data. In a case that a phase change memory device is adopted as the variable resistance memory device according to example embodiments, the variable resistance patterns VRP may include a material whose phase is changed between a crystalline state and an amorphous state based on temperature. For example, the variable resistance patterns VRP may have a phase transition temperature of about 250° C. to 350° C. between the crystalline and amorphous states. The variable resistance patterns VRP may be formed of a compound in which one or more of Te and Se as chalcogenide elements are combined with one or more of Ge, Sb, Bi, Pb, Sn, Ag, As, S, Si, In, Ti, Ga, P, O, and C. For example, the variable resistance patterns VRP may include one or more of GeSbTe, GeTeAs, SbTeSe, GeTe, SbTe, SeTeSn, GeTeSe, SbSeBi, GeBiTe, GeTeTi, InSe, GaTeSe, and InSbTe. For another example, the variable resistance patterns VRP may include a superlattice structure in which a Ge-containing layer and a Ge-free layer are repeatedly stacked. For another example, the variable resistance patterns VRP may include a structure in which a GeTe layer and a SbTe layer are repeatedly stacked.

In other example embodiments, the variable resistance patterns VRP may include one or more of perovskite compounds and conductive metal oxides. For example, the variable resistance patterns VRP may include one or more of niobium oxide, titanium oxide, nickel oxide, zirconium oxide, vanadium oxide, PCMO((Pr,Ca)MnO3), strontium-titanium oxide, barium-strontium-titanium oxide, strontium-zirconium oxide, barium-zirconium oxide, and barium-strontium-zirconium oxide. When the variable resistance patterns VRP include transition metal oxides, the variable resistance patterns VRP may have a dielectric constant greater than that of a silicon oxide layer. In other example embodiments, the variable resistance patterns VRP may have either a double structure having a conductive metal oxide layer and a tunnel dielectric layer or a triple structure having a first conductive metal oxide layer, a tunnel dielectric layer, and a second conductive metal oxide layer. The tunnel dielectric layer may include aluminum oxide, hafnium oxide, or silicon oxide.

Bottom electrode patterns 133 may be provided between the first conductive lines CL1 and the variable resistance patterns VRP. Each of the bottom electrode patterns 133 may connect a pair of variable resistance patterns VRP neighboring in the first direction D1 to the first conductive lines CL1. For example, each of the bottom electrode patterns 133 may include a bottom portion 133a connected to the first conductive lines CL1 and also include a pair of sidewall portions 133b extending from opposite ends of the bottom portion 133a toward a pair of variable resistance patterns VRP. For another example, the bottom electrode patterns 133 may be two-dimensionally arranged at intersections of the first conductive lines CL1 and the second conductive lines CL2. Each of the bottom electrode patterns 133 may have a uniform thickness and a U-shaped cross-section in the first direction D1. Each of the bottom electrode patterns 133 may have a non-flat top surface and a width less than that of the variable resistance pattern VRP.

The sidewall portions 133b of the bottom electrode patterns 133 may be in direct contact with corresponding variable resistance patterns VRP. The bottom electrode patterns 133 may be electrodes that heat and phase-change the variable resistance patterns VRP. The bottom electrode patterns 133 may be formed of a material whose resistivity is greater than that of the first conductive lines CL1. For example, the bottom electrode patterns 133 may include one or more of W, Ti, Al, Cu, C, CN, TiN, TiAlN, TiSiN, TiCN, WN, CoSiN, WSiN, TaN, TaCN, TaSiN, and TiO.

A spacer pattern 143 may be provided between the first buried dielectric pattern 151 and each of the bottom electrode patterns 133. The spacer pattern 143 may extend along the bottom portion 133a and sidewall portions 133b of the bottom electrode pattern 133. The spacer pattern 143 may have a uniform thickness on the bottom electrode pattern 133. The thickness of the spacer pattern 143 may be substantially equal to or greater than that of the bottom electrode pattern 133. The spacer pattern 143 may include a first segment 143a covering the bottom portion 133a of the bottom electrode pattern 133 and a second segment 143b covering the sidewall portion 133b of the bottom electrode pattern 133. For example, the spacer pattern 143 may have a U-shaped cross-section in the first direction D1.

In certain embodiments, the spacer pattern 143 may be formed of a dielectric material doped with impurities. The dielectric material doped with impurities may be different from those of the mold dielectric pattern 121 and the first and second buried dielectric patterns 151 and 161.

The impurities doped in the spacer pattern 143 may include one or more of germanium (Ge), tin (Sn), tungsten (W), titanium (Ti), tantalum (Ta), aluminum (Al), zirconium (Zr), hafnium (Hf), nickel (Ni), and cobalt (Co).

The spacer pattern 143 may include a metal element, a silicon element, and an oxygen element. For example, the impurities doped in the spacer pattern 143 may include the same metal element as that of the bottom electrode pattern 133. When the bottom electrode pattern 133 and the spacer pattern 143 include the same metal element, the metal element in the spacer pattern 143 may have a lower concentration than that of the metal element in the bottom electrode pattern 133.

For example, the spacer pattern 143 may include silicon oxide doped with titanium (Ti). For another example, the spacer pattern 143 may include silicon oxide doped with germanium (Ge) or carbon (C).

The spacer pattern 143 may have an inner wall in direct contact with the first buried dielectric pattern 151. The bottom electrode pattern 133 and the spacer pattern 143 may have their top surfaces at a lower level than that of top surfaces of the mold dielectric pattern 121 and the first and second buried dielectric patterns 151 and 161.

In certain embodiments, the first buried dielectric pattern 151 may have a discontinuous interface IS therein. In this description, the term "discontinuous interface IS" may mean the presence of material capable of being detected by composition difference of material, grain variation of material, seams, voids, or analysis equipment such as transmission electron microscope (TEM) or scanning electron microscope (SEM).

The discontinuous interface IS in the first buried dielectric pattern 151 may be present between the sidewall portions 133b of the bottom electrode pattern 133. As shown FIGS. 6A and 6B, the discontinuous interface IS may be a seam in the first buried dielectric pattern 151. Alternatively, as shown in FIG. 6C, the discontinuous interface IS may be a void formed inside the first buried dielectric pattern 151.

Referring to FIG. 6A, each variable resistance pattern VRP may have a width in the first direction D1 greater than a sum of a width of the sidewall portion 133b of the bottom electrode pattern 133 and a width of the second segment 143b of the spacer pattern 143. The width of the variable resistance pattern VRP may correspond to a distance between a sidewall of the mold dielectric pattern 121 and a sidewall of the first buried dielectric pattern 151, which sidewalls are in contact with the variable resistance pattern VRP.

Referring to FIG. 6B, the width in the first direction D1 of each variable resistance pattern VRP may be substantially equal to the sum of the width of the sidewall portion 133b of the bottom electrode pattern 133 and the width of the second segment 143b of the spacer pattern 143.

The middle electrodes ME may be disposed on corresponding variable resistance patterns VRP. The middle electrodes ME may electrically connect the variable resistance patterns VRP to the switching elements SW, and may prevent direct contacts between the variable resistance patterns VRP and the switching elements SW. The middle electrodes ME may include one or more of W, Ti, Al, Cu, C, CN, TiN, TiAlN, TiSiN, TiCN, WN, CoSiN, WSiN, TaN, TaCN, and TaSiN.

The middle electrodes ME may be provided on upper portions of the recess regions ER. For example, the middle electrodes ME may have their top surfaces substantially coplanar with that of the mold dielectric pattern 121 and those of the first and second buried dielectric patterns 151 and 161.

The switching elements SW may be disposed on corresponding middle electrodes ME. Each of the switching elements SW may have a width in the first direction D1 equal to or greater than the width of the variable resistance pattern VRP. The switching elements SW may be OTS (Ovonic Threshold Switch) devices exhibiting bidirectional characteristics. For example, the switching elements SW may be devices based on a threshold switching phenomenon exhibiting a nonlinear I-V curve (e.g., S-typed I-V curve). The switching elements SW may have a phase transition temperature at which the phase of the phase of a material forming the switching elements SW is changed between a crystalline state and an amorphous state that is greater than the phase transition temperature of the variable resistance pattern VRP. For example, the switching elements SW may have a phase transition temperature of about 350° C. to about 450° C. Therefore, when operating the variable resistance memory device according to example embodiments, the variable resistance pattern VRP may be configured to change its phase between crystalline and amorphous states, while the switching element SW may maintain its substantially amorphous state without the phase transition. In this description, the phrase "substantially amorphous state" may not exclude the presence of a locally crystalline grain boundary or a locally crystalline portion in an object.

The switching elements SW may be formed of a compound in which one or more of Te and Se as chalcogenide elements are combined with one or more of Ge, Sb, Bi, Al, Pb, Sn, Ag, As, S, Si, In, Ti, Ga, and P. The switching elements SW may further include a thermal stabilization element in addition to the compound. The thermal stabilization element may be one or more of C, N, and O. For example, the switching elements SW may include one or more of AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, and GeAsBiSe.

Top electrodes TE may be provided between the switching elements SW and the second conductive lines CL2. The top electrodes TE may be arranged two-dimensionally spaced apart from one another on corresponding switching elements SW. Alternatively, each of the top electrodes TE may be connected in common to the switching elements SW arranged along the second direction D2.

An upper interlayer dielectric layer 170 may be disposed on the mold dielectric pattern 121 and the first and second buried dielectric patterns 151 and 161. The upper interlayer dielectric layer 170 may fill spaces between the switching elements SW. The upper interlayer dielectric layer 170 may be formed of a low-k dielectric material. The upper interlayer dielectric layer 170 may have a top surface coplanar with those of the top electrodes TE.

The second conductive lines CL2 may be provided on the top electrodes TE. The second conductive lines CL2 may extend in the second direction D2 and be spaced apart from one another in the first direction D1.

Figure 7:
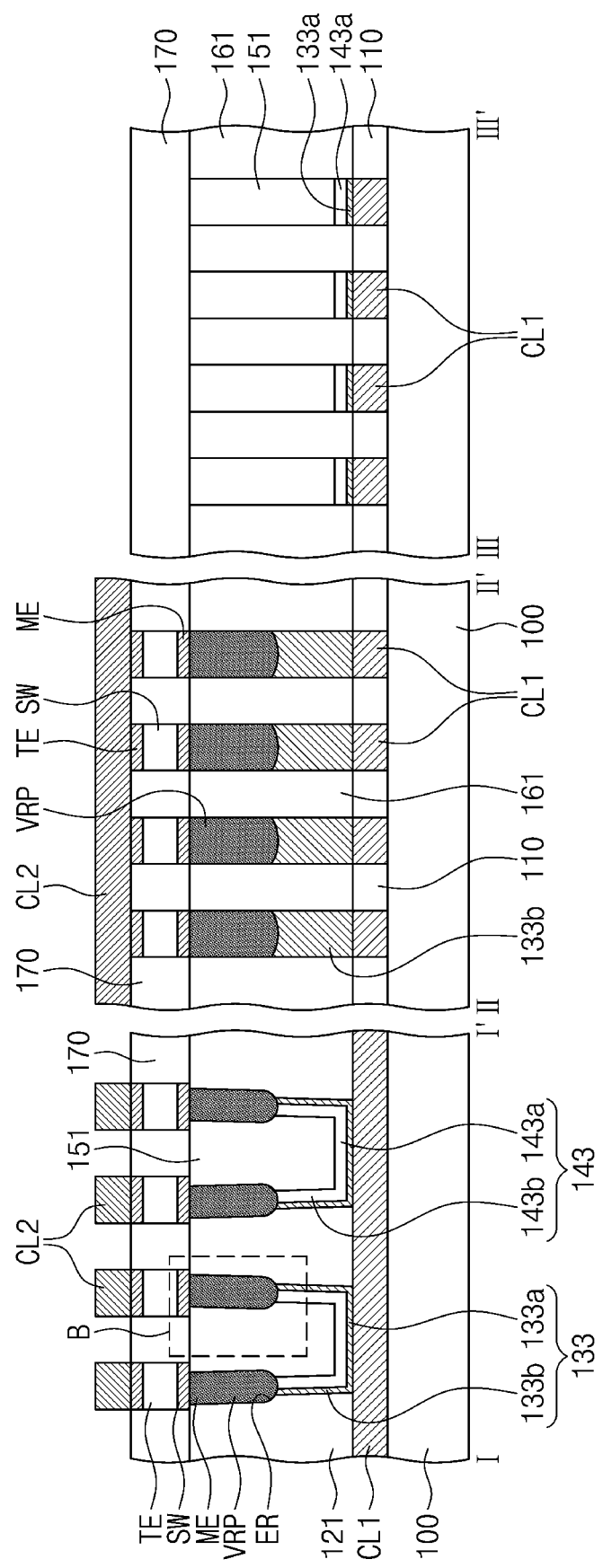
FIG. 7 illustrates a cross-sectional view taken along lines I-I', II-II', and III-III' of FIG. 4, showing a variable resistance memory device according to example embodiments.
Figure 8:
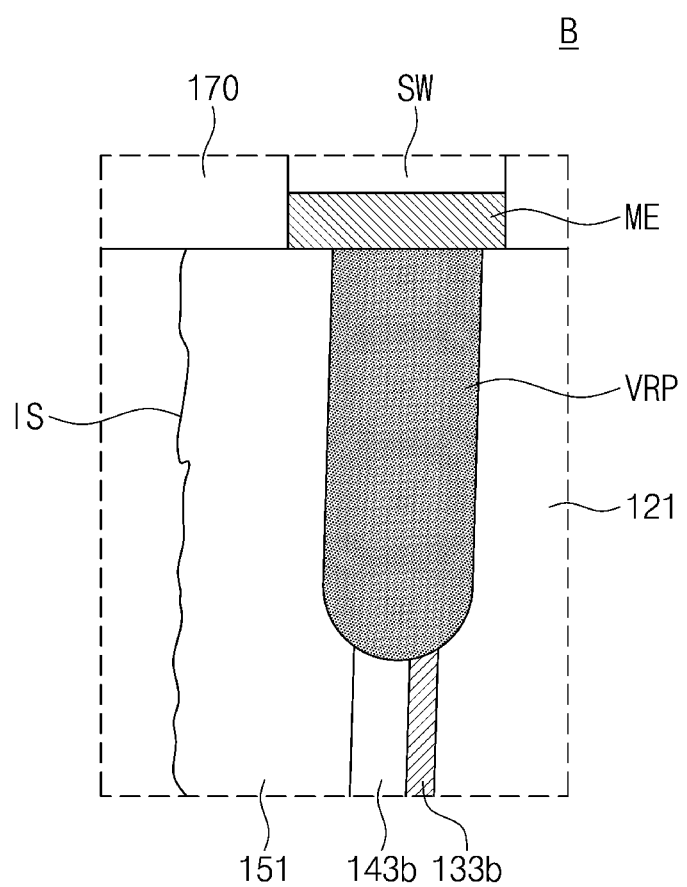
FIG. 8 illustrates an enlarged view showing section B of FIG. 7.

FIG. 7 illustrates a cross-sectional view taken along lines I-I', II-II', and III-III' of FIG. 4, showing a variable resistance memory device according to example embodiments. FIG. 8 illustrates an enlarged view showing section B of FIG. 7. A description of duplicate components may be omitted in the interest of brevity.

Referring to FIGS. 7 and 8, the variable resistance patterns VRP may have their top surfaces at substantially the same level as that of a top surface of the mold structure ML. For example, the top surfaces of the variable resistance patterns VRP may be coplanar with that of the mold dielectric pattern 121 and those of the first and second buried dielectric patterns 151 and 161.

The middle electrodes ME may be provided on the mold dielectric pattern 121 and the first and second buried dielectric patterns 151 and 161. The middle electrodes ME may have their sidewalls vertically aligned with those of the switching elements SW.

<Fabrication Method>

Figure 9:
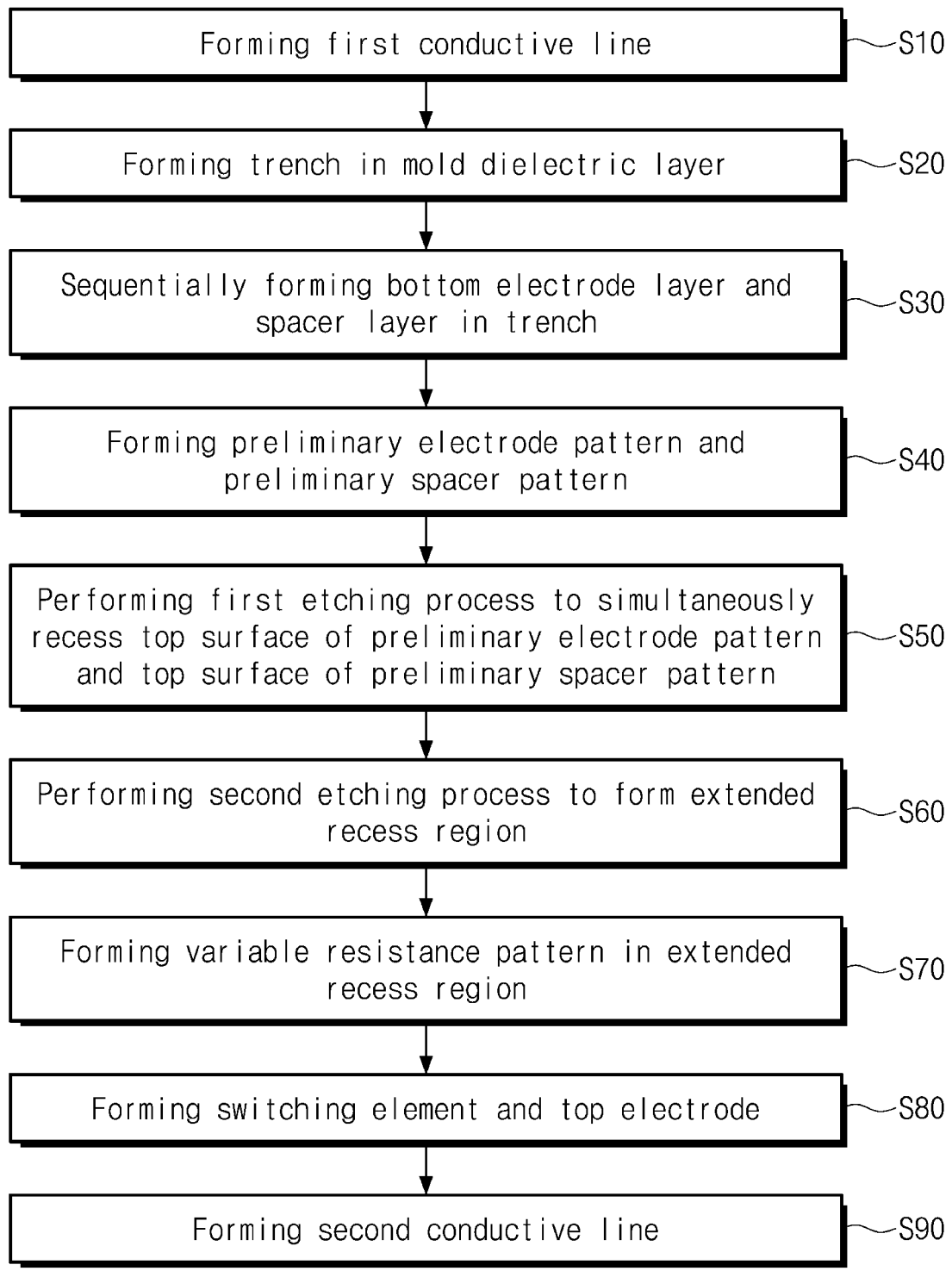
FIG. 9 illustrates a flow chart showing a method of fabricating a variable resistance memory device according to example embodiments.

FIG. 9 illustrates a flow chart showing a method of fabricating a variable resistance memory device according to example embodiments.

Figure 10B:
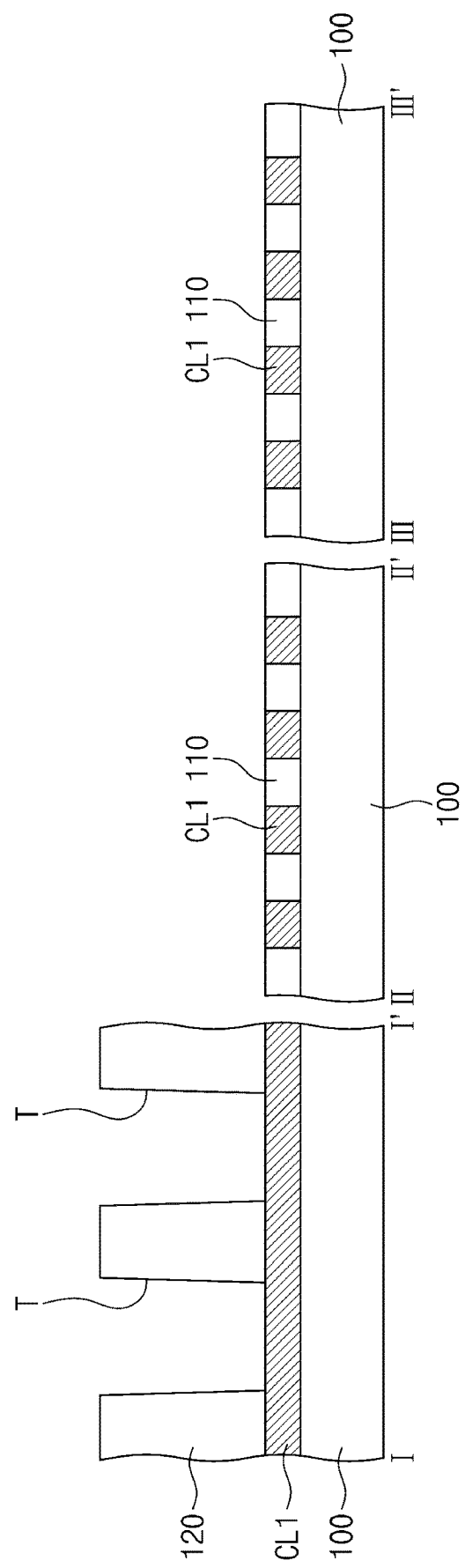
Figure 11A:
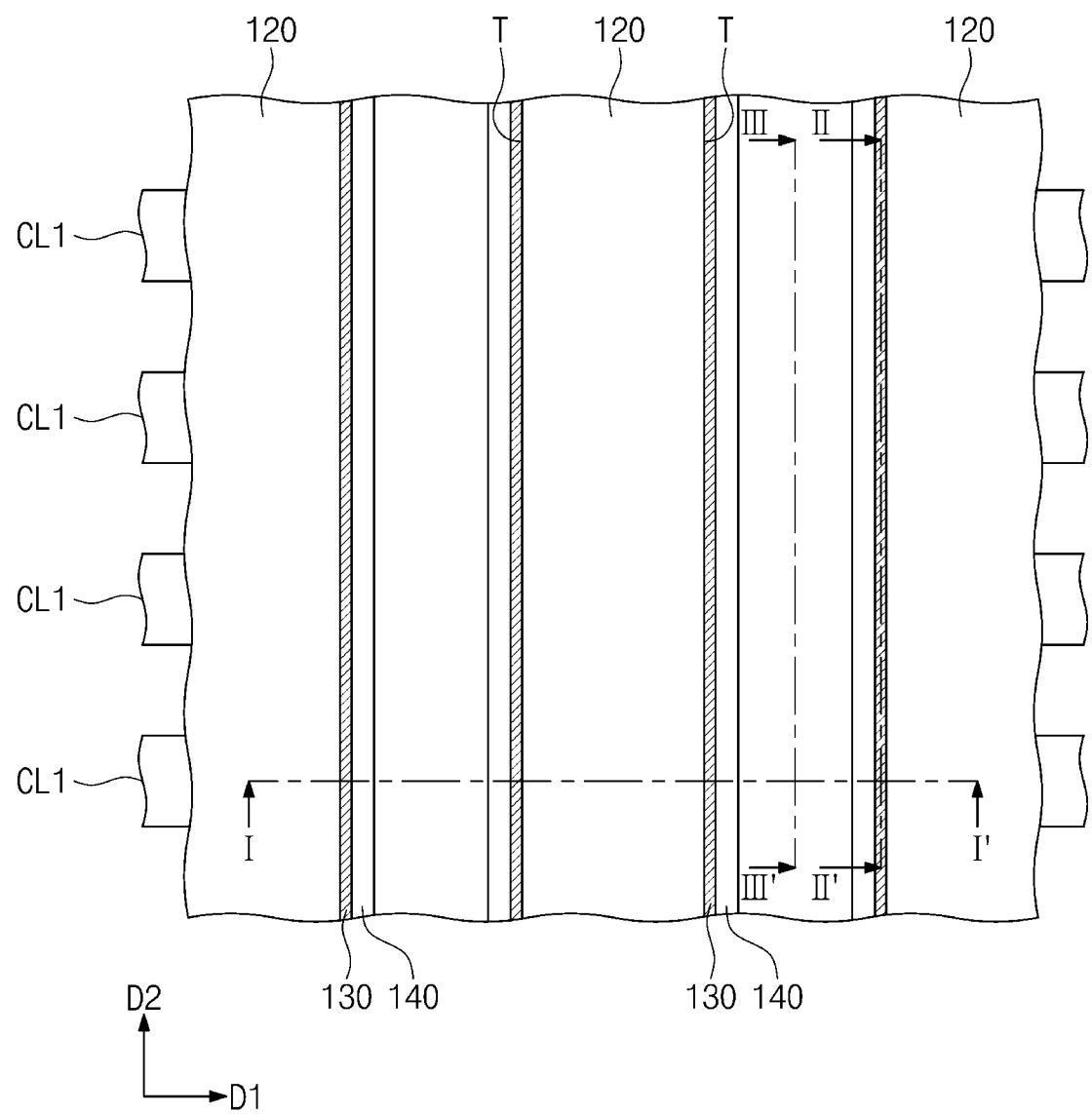
Figure 11B:
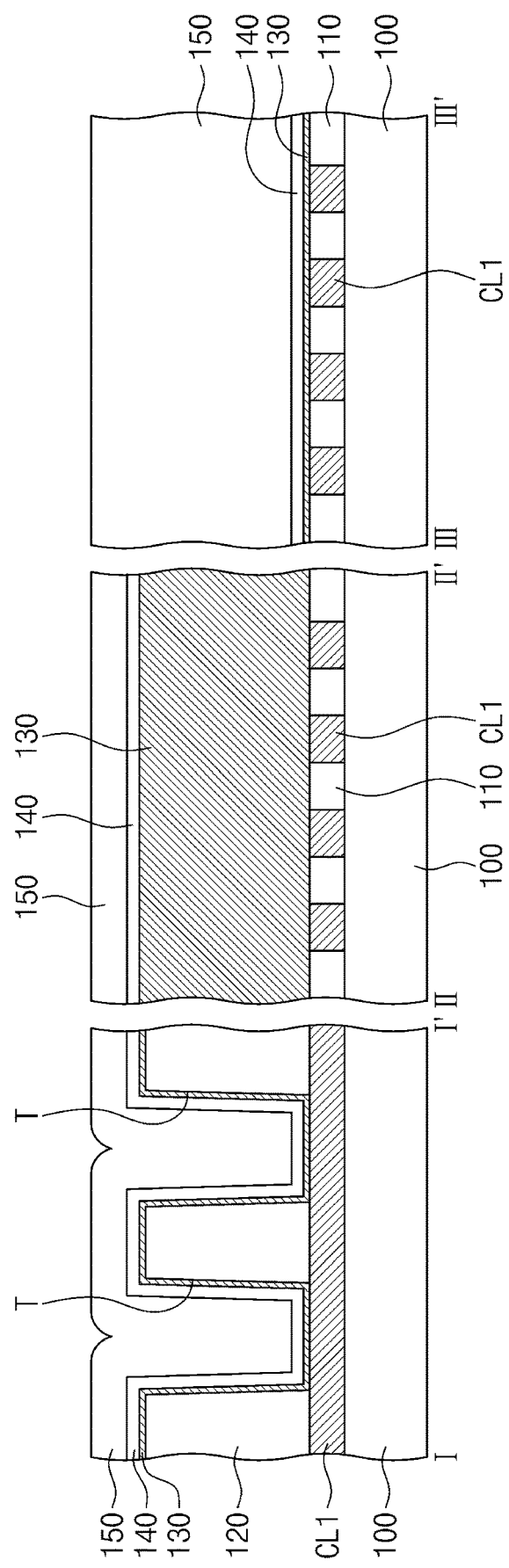
Figure 12A:
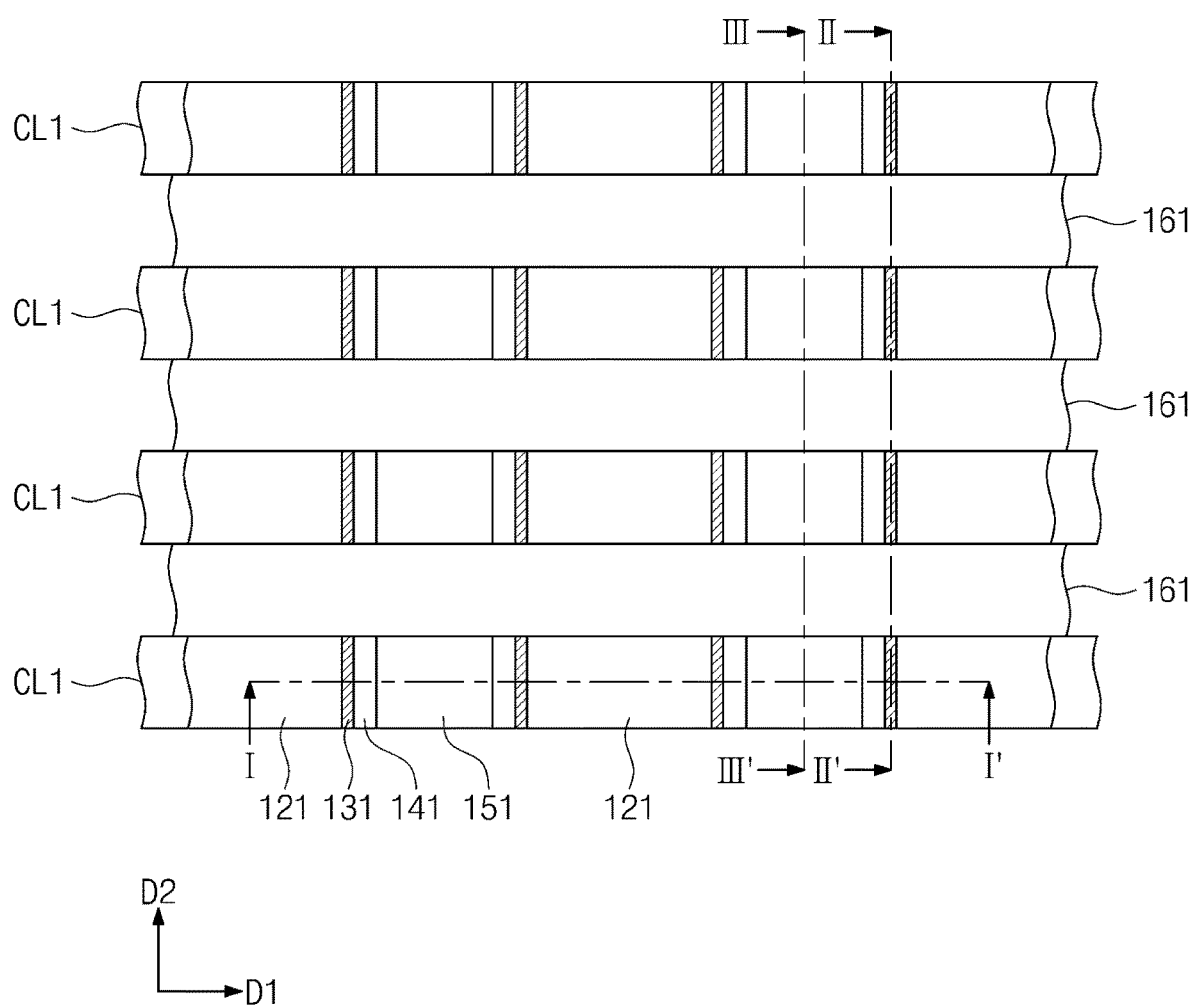
Figure 13:
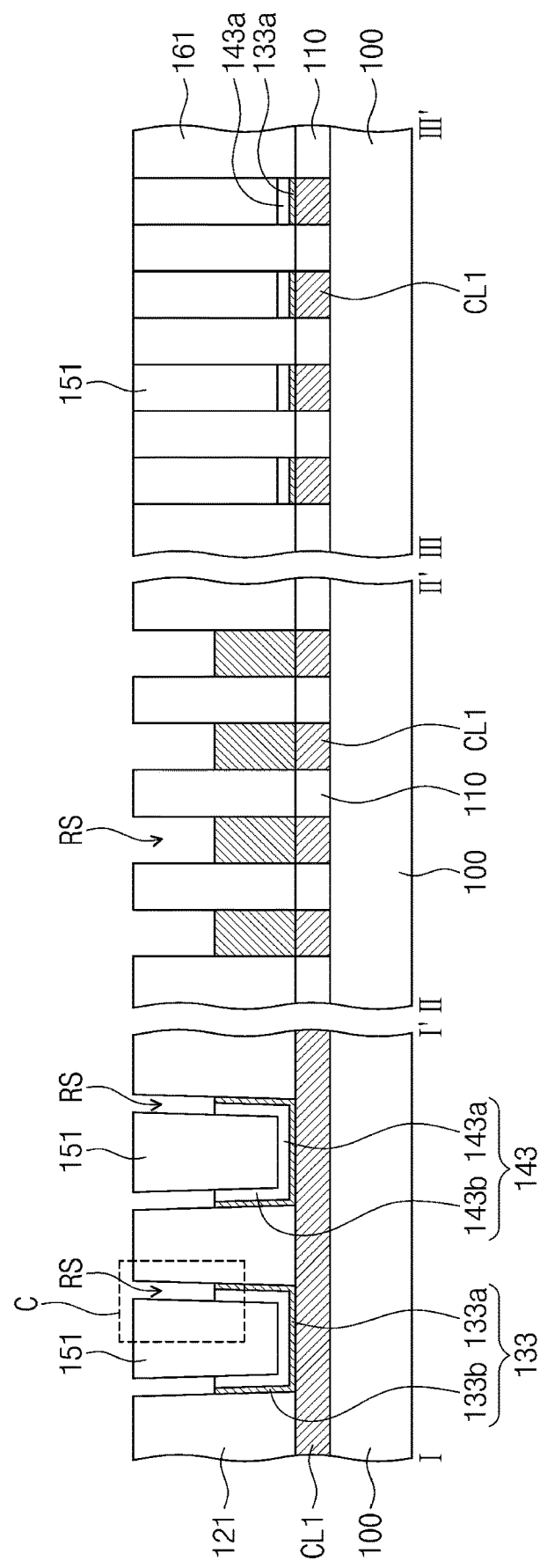
FIGS. 13, 15, and 17 illustrate cross-sectional views showing a method of fabricating a variable resistance memory device according to example embodiments.
Figure 14:
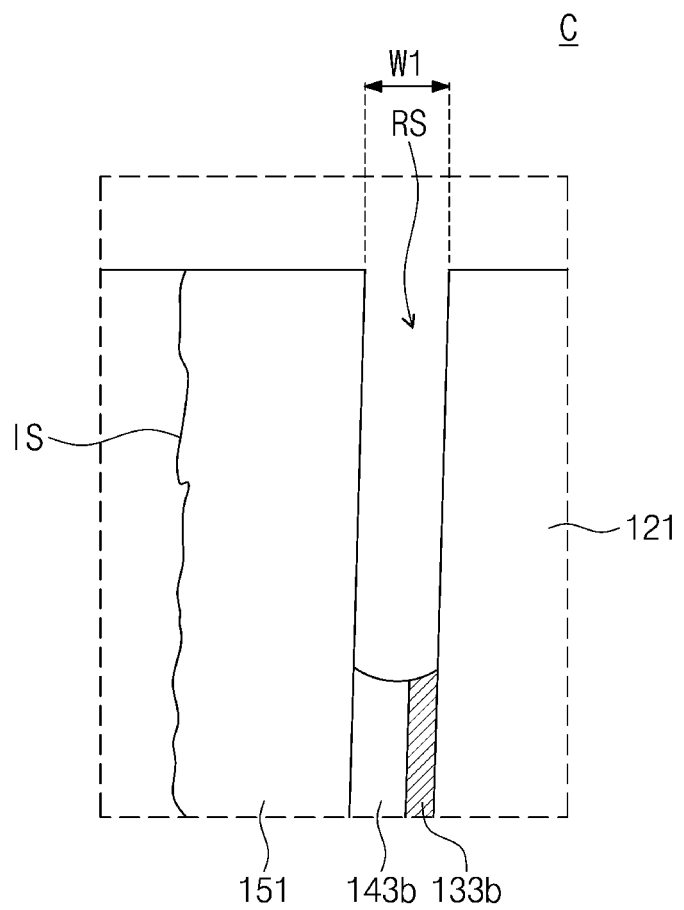
FIG. 14 illustrates an enlarged view showing section C of FIG. 13.
Figure 15:
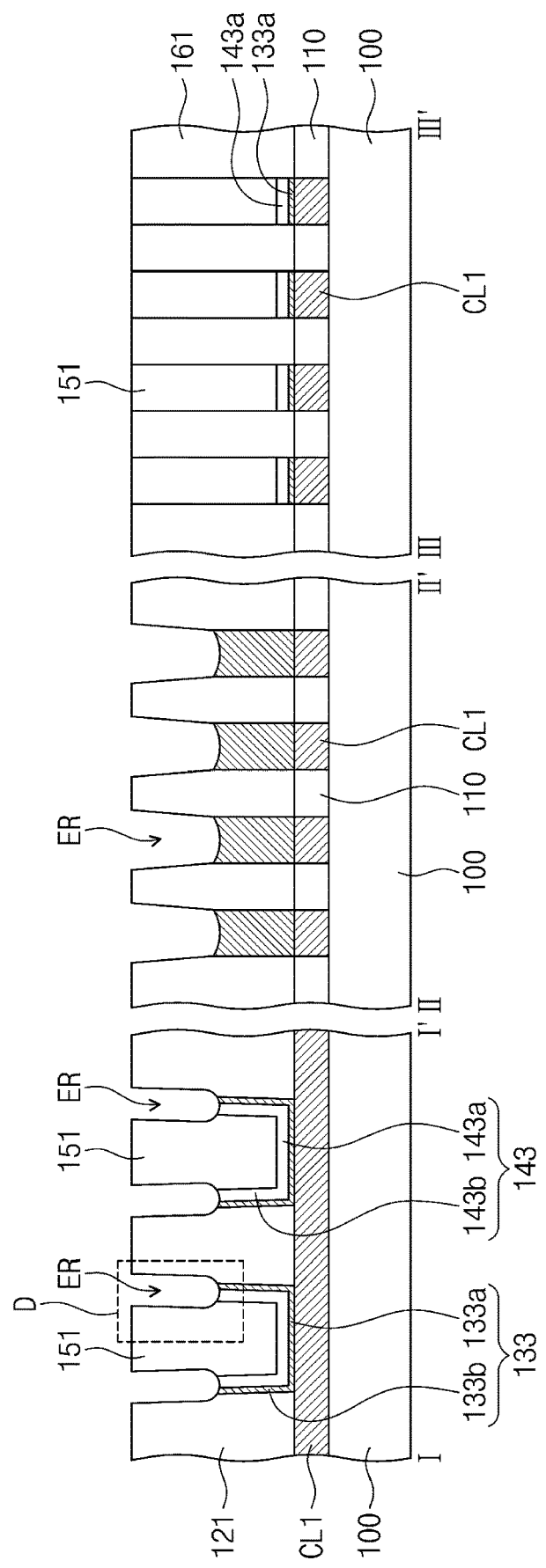
Figure 16:
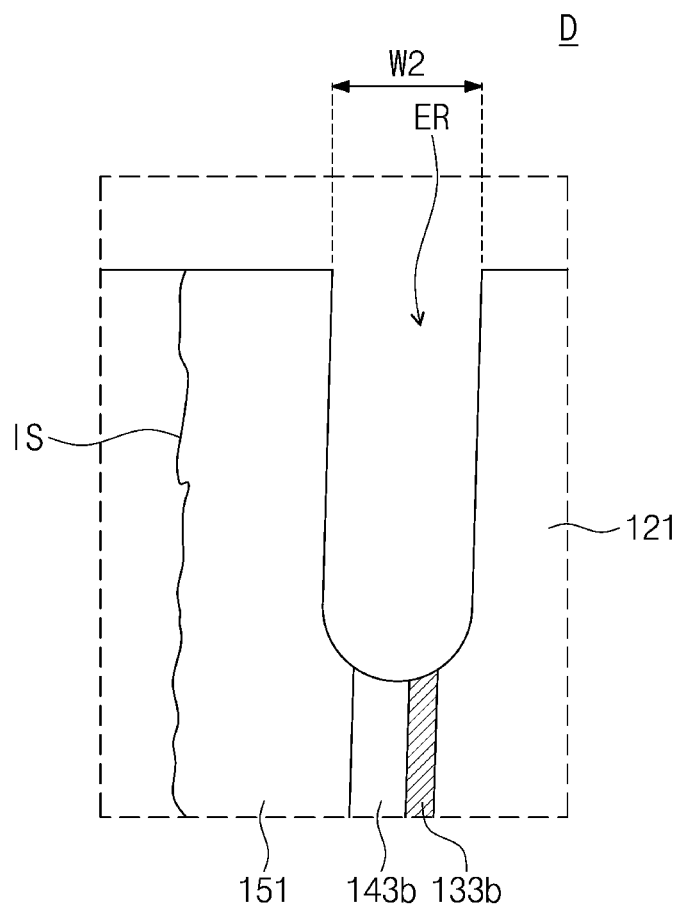
FIG. 16 illustrates an enlarged view showing section D of FIG. 15.
Figure 17:
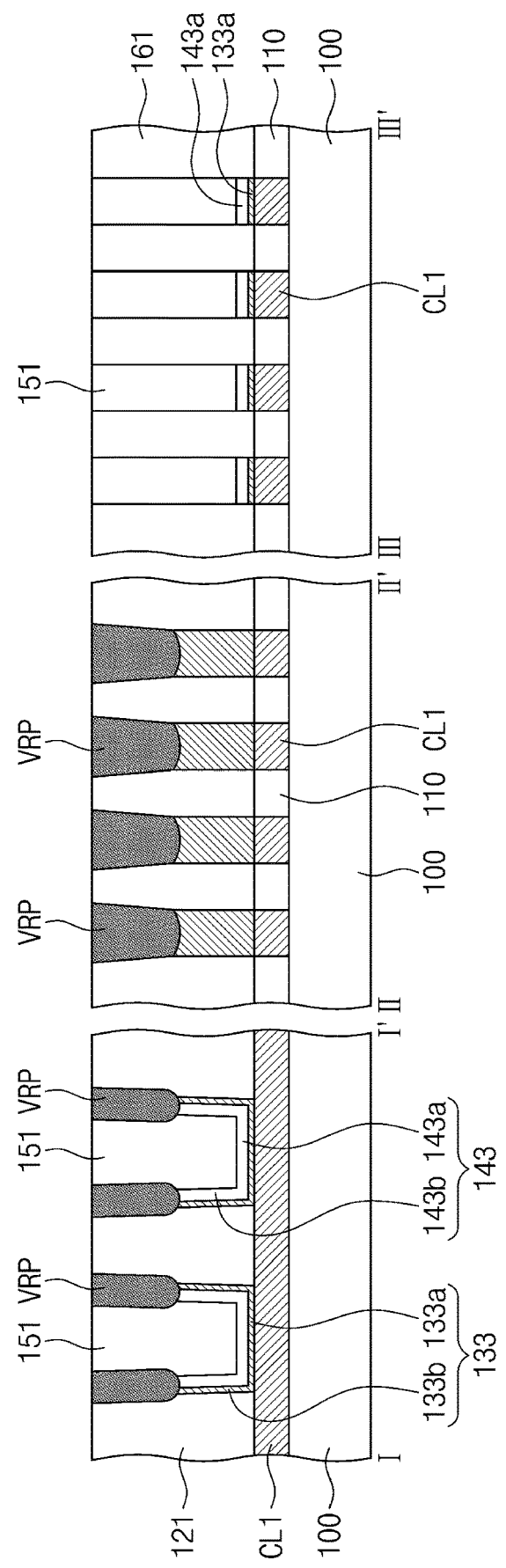

FIGS. 10A, 11A, and 12A illustrate plan views showing a method of fabricating a variable resistance memory device according to example embodiments. FIGS. 10B, 11B, and 12B illustrate cross-sectional views taken along lines I-I', II-II', and III-III' of FIGS. 10A, 11A, and 12A, showing a method of fabricating a variable resistance memory device according to example embodiments. FIGS. 13, 15, and 17 illustrate cross-sectional views showing a method of fabricating a variable resistance memory device according to example embodiments. FIG. 14 illustrates an enlarged view showing section C of FIG. 13. FIG. 16 illustrates an enlarged view showing section D of FIG. 15.

Referring to FIGS. 9, 10A, and 10B, first conductive lines CL1 may be formed on a substrate 100 to extend in a first direction D1 and be spaced apart from one another in a second direction D2 (S10).

The first conductive lines CL1 may be formed by depositing a conductive layer on the substrate 100 and then patterning the conductive layer. After the first conductive lines CL1 are formed, a lower interlayer dielectric layer 110 may be formed to fill spaces between the first conductive lines CL1. The formation of the first conductive lines CL1 by patterning the conductive layer may be performed when patterning a bottom electrode layer 130 which will be discussed below.

The first conductive lines CL1 may include one or more of doped semiconductor materials (e.g., doped silicon), metals (e.g., tungsten, aluminum, titanium, and/or tantalum), conductive metal nitrides (e.g., titanium nitride, tantalum nitride, and/or tungsten nitride), and metal-semiconductor compounds (e.g., metal silicide). The bottom electrode layer 130, which will be discussed below, may include one or more of W, Ti, Ta, Al, C, CN, TiN, TiAlN, TiSiN, TiCN, WN, CoSiN, WSiN, TaN, TaCN, and TaSiN.

Referring further to FIGS. 9, 10A, and 10B, a mold dielectric layer 120 may be formed on the first conductive lines CL1 that has trenches T extending either in the first direction D1 or in the second direction D2 (S20).

The mold dielectric layer 120 may cover top surfaces of the first conductive lines CL1. The mold dielectric layer 120 may include silicon nitride or silicon oxynitride. The mold dielectric layer 120 may be formed using a deposition process performed at relatively low temperatures, for example, equal to or less than about 400° C.

A line-shaped mask pattern (not shown) may be formed on the mold dielectric layer 120, and then used to etch the mold dielectric layer 120 to expose the top surface of the first conductive lines CL1, with the result that the trenches T may be formed. The trenches T may extend in the second direction D2 to run across the first conductive lines CL1, and may be spaced apart from one another in the first direction D1. Each of the trenches T may be formed between a pair of first conductive lines CL1. When the mold dielectric layer 120 is anisotropically etched to form the trenches T, each of the trenches T may have inclined opposite sidewalls.

The mold dielectric layer 120 may be formed on the first conductive lines CL1, but the inventive concepts are not limited thereto. The mold dielectric layer 120 having the trenches T may be formed on a conductive layer covering an entire surface of the substrate 100.

Referring to FIGS. 9, 11A, and 11B, a bottom electrode layer 130 and a spacer layer 140 may be sequentially formed on the mold dielectric layer 120 having the trenches T formed therein (S30).

The bottom electrode layer 130 and the spacer layer 140 may be formed using a layer-formation technique with excellent step coverage or superior film conformality, such as chemical vapor deposition (CVD) or atomic layer deposition (ALD).

The bottom electrode layer 130 may conformally cover inner walls of the trenches T. The bottom electrode layer 130 may be formed using one of atomic layer deposition (ALD), metal organic chemical vapor deposition (MO-CVD), thermal CVD, plasma CVD, and electron cyclotron resonance chemical vapor deposition (ECR-CVD). The bottom electrode layer 130 may have a deposition thickness of about 0.1 nm to about 10 nm. The bottom electrode layer 130 may be formed of one or more of metal element-containing nitrides, metal element-containing oxynitrides, carbon (C), titanium (Ti), tantalum (Ta), aluminum titanium (TiAl), zirconium (Zr), hafnium (Hf), molybdenum (Mo), aluminum (Al), aluminum-copper (Al—Cu), aluminum-copper-silicon (Al—Cu—Si), copper (Cu), tungsten (W), tungsten titanium (TiW), and tungsten silicide (WSix). The metal element-containing nitrides may include TiN, TaN, WN, MoN, NbN, TiSiN, TiAlN, TiBN, ZrSiN, WSiN, WBN, ZrAlN, MoSiN, MoAlN, TaSiN, or TaAlN, and the metal element-containing oxynitrides may include TiON, TiAlON, WON, or TaON.

The spacer layer 140 may be formed of a dielectric material different from that of the mold dielectric layer 120. The spacer layer 140 may be formed of a dielectric material having a high etch selectivity with respect to the mold dielectric layer 120, but having a low etch selectivity with respect to the bottom electrode layer 130. In certain embodiments, the spacer layer 140 may be formed of a dielectric material doped with impurities. The impurities may include one or more of germanium (Ge), tin (Sn), tungsten (W), titanium (Ti), tantalum (Ta), aluminum (Al), zirconium (Zr), hafnium (Hf), nickel (Ni), and cobalt (Co).

The spacer layer 140 may include a metal element, a silicon element, and an oxygen element. The spacer layer 140 may be a silicon oxide layer doped with a metal element. The metal element may include one or more of tungsten (W), titanium (Ti), tantalum (Ta), aluminum (Al), zirconium (Zr), hafnium (Hf), nickel (Ni), and cobalt (Co). Alternatively, the spacer layer 140 may be a silicon oxide layer doped with germanium (Ge).

In certain embodiments, the impurities in the spacer layer 140 may include the same metal element as that of the bottom electrode layer 130. For example, the bottom electrode layer 130 and the spacer layer 140 may include titanium (Ti), and the spacer layer 140 may have a titanium (Ti) concentration lower than that of the bottom electrode layer 130.

The spacer layer 140 may be formed using one of atomic layer deposition (ALD), metal organic chemical vapor deposition (MO-CVD), thermal CVD, plasma CVD, and electron cyclotron resonance chemical vapor deposition (ECR-CVD). Impurities may be doped into the spacer layer 140 during its deposition, and a doping amount of the impurities may affect an etch rate in a first etching process which will be discussed below. For example, the spacer layer 140 may be formed by in-situ doping impurities while atomic layer deposition is employed to form a silicon oxide layer.

The spacer layer 140 may be deposited to have a uniform thickness on the bottom electrode layer 130. The spacer layer 140 may have a deposition thickness substantially equal to or greater than that of the bottom electrode layer 130. The deposition thickness of the spacer layer 140 may be, for example, about 1 nm to about 10 nm.

A sum of thicknesses of the bottom electrode layer 130 and the spacer layer 140 may be less than half a width of the trench T. The bottom electrode layer 130 and the spacer layer 140 may thus define an empty space in the trench T.

A first buried dielectric layer 150 may be formed to fill the trench T in which are formed the bottom electrode layer 130 and the spacer layer 140. The first buried dielectric layer 150 may be formed of a dielectric material different from that of the spacer layer 140. For example, the first buried dielectric layer 150 may include silicon oxide or silicon oxynitride. The first buried dielectric layer 150 may be formed using a deposition process performed at relatively low temperatures, for example, equal to or less than about 400° C. The first buried dielectric layer 150 may be formed by, for example, plasma enhanced atomic layer deposition.

When the first buried dielectric layer 150 is deposited to fill the empty space defined by the bottom electrode layer 130 and the spacer layer 140, a discontinuous interface (e.g., seam or void) may be formed in the first buried dielectric layer 150, as discussed with reference to FIGS. 6A, 6B, and 6C. The discontinuous interface (e.g., seam or void) may extend along the second direction D2.

Referring to FIGS. 9, 12A, and 12B, preliminary electrode patterns 131 and preliminary spacer patterns 141 may be formed that are spaced apart from each other in the first and second directions D1 and D2 (S40).

For example, after the first buried dielectric layer 150 is formed, a planarization process may be performed to expose the mold dielectric layer 120. After the planarization process, the bottom electrode layer 130, the spacer layer 140, and the first buried dielectric layer 150 may extend along the second direction D2 in the trench T.

When the planarization process is completed, a mask pattern (not shown) may be formed to run across the bottom electrode layer 130, the spacer layer 140, and the mold dielectric layer 120 along the first direction D1. The mask pattern may be used to anisotropically etch the mold dielectric layer 120, the first buried dielectric layer 150, the bottom electrode layer 130, and the spacer layer 140 to respectively form a mold dielectric pattern 121, a first buried dielectric pattern 151, a preliminary electrode pattern 131, and a preliminary spacer pattern 141. A plurality of line-shaped openings extending in the first direction D1 may be formed between the preliminary electrode patterns 131 neighboring in the second direction D2.

Each of the preliminary electrode patterns 131 may include a bottom portion 131a in contact with the first conductive line CL1 and sidewall portions 131b vertically protruding from opposite ends of the bottom portion 131a. Each of the preliminary spacer patterns 141 may include a first segment 141a and second segments 141b vertically protruding from opposite ends of the first segment 141a. The sidewall portions 131b of the preliminary electrode patterns 131 may have their top surfaces substantially coplanar with those of the second segments 141b of the preliminary spacer patterns 141.

In certain embodiments, when no first conductive lines are formed below the mold dielectric layer 120, first conductive lines may also be formed during an anisotropic etching process performed to form the preliminary electrode pattern 131 and the preliminary spacer pattern 141.

Second buried dielectric patterns 161 may fill spaces between the preliminary electrode patterns 131 and the preliminary spacer patterns 141 adjacent to each other in the second direction D2. For example, the second buried dielectric patterns 161 may fill the openings. The second buried dielectric patterns 161 may be formed of the same material as that of the mold dielectric pattern 121 and the first buried dielectric patterns 151, and may cover a sidewall of the preliminary electrode pattern 131 and a sidewall of the preliminary spacer pattern 141.

The second buried dielectric patterns 161 may be formed by depositing a second buried dielectric layer (not shown) on the substrate 100 on which are formed the preliminary electrode patterns 131 and the preliminary spacer patterns 141, and then performing a planarization process. The second buried dielectric layer may be formed using a deposition process performed at relatively low temperatures, for example, equal to or less than about 400° C. The second buried dielectric patterns 161 may include a discontinuous interface (e.g., seam or void), which discontinuous interface may be formed along the first direction D1.

Referring to FIGS. 9, 13, and 14, a first etching process may be performed to simultaneously recess top surfaces of the preliminary electrode patterns 131 and top surfaces of the preliminary spacer patterns 141 (S50).

The first etching process may be an isotropic wet etching process using a first etchant that has an etch selectivity with respect to the mold dielectric layer 120 and the first and second buried dielectric patterns 151 and 161. In the first etching process, an etch rate of the preliminary spacer pattern 141 may depend on a concentration of impurities doped in the preliminary spacer pattern 141. The preliminary electrode patterns 131 and the preliminary spacer patterns 141 may be etched at the same time in the first etching process using the first etchant. The preliminary electrode patterns 131 and the preliminary spacer patterns 141 may be etched at an etch selectivity ratio of about 1:1 or about 1.5:1 in the first etching process using the first etchant.

When the preliminary electrode patterns 131 are formed of metal element-containing nitrides and the preliminary spacer patterns 141 are formed of metal element-doped silicon oxides, the first etchant may include ammonium hydroxide ($NH_4OH$), hydrogen peroxide ($H_2O_2$), and deionized water.

The first etching process may form a preliminary recess region RS that partially exposes a sidewall of the mold dielectric pattern 121 and sidewalls of the first and second buried dielectric patterns 151 and 161, and also form a bottom electrode pattern 133 and a spacer pattern 143. As discussed above, the bottom electrode pattern 133 may include a bottom portion 133a connected to the first conductive lines CL1 and a pair of sidewall portions 133b vertically protruding from opposite ends of the bottom portion 133a. The spacer pattern 143 may include, as discussed above, a first segment 143a covering the bottom portion 133a of the bottom electrode pattern 133 and a second segment 143b covering the sidewall portion 133b of the bottom electrode pattern 133.

As shown in FIG. 14, the preliminary recess region RS may have a first width W1 in the first direction D1 that corresponds to a sum of thicknesses of the bottom electrode pattern 133 and the spacer pattern 143. When an isotropic wet etching process is performed to form the preliminary recess region RS, the bottom electrode pattern 133 and the spacer pattern 143 may each have a rounded top surface.

In certain embodiments, because the top surfaces of the preliminary electrode pattern 131 and the preliminary spacer pattern 141 made of different materials are recessed at the same time, the method of fabricating a variable resistance memory device may be simplified.

Because the first etching process uses an etch recipe having an etch selectivity with respect to the mold dielectric pattern 121 and the first and second buried dielectric patterns 151 and 161, the mold dielectric pattern 121 and the first and second buried dielectric patterns 151 and 161 may be prevented from damage while the preliminary recess region RS is formed.

Referring to FIGS. 9, 15, and 16, a second etching process may be performed to form an expanded recess region ER of which a width is greater than that of the preliminary recess region RS (S60).

The second etching process may be an isotropic wet etching process. The second etching process may use a second etchant having an etch selectivity with respect to the bottom electrode patterns 133 and the spacer patterns 143. The second etching process may partially etch the sidewalls of the mold dielectric pattern 121 and the first and second buried dielectric patterns 151 and 161.

When the mold dielectric pattern 121 and the first and second buried dielectric patterns 151 and 161 are formed of silicon nitride or silicon oxynitride, the second etchant may include phosphoric acid.

As shown in FIG. 16, the expanded recess region ER may have a second width W2 greater than the first width W1 of the preliminary recess region RS. Because the second etching process causes the expanded recess region ER to have an increased width, the expanded recess region ER may be easily filled with a variable resistance pattern VRP which will be discussed below.

Referring to FIGS. 9 and 17, a variable resistance pattern VRP may be formed in the expanded recess region ER (S70).

For example, a variable resistance layer may be formed to fill the expanded recess regions ER, and then an upper portion of the variable resistance layer may be etched to form the variable resistance patterns VRP. The variable resistance layer may include one or more of GeSbTe, GeTeAs, SbTeSe, GeTe, SbTe, SeTeSn, GeTeSe, SbSeBi, GeBiTe, GeTeTi, InSe, GaTeSe, and InSbTe. The variable resistance layer may be formed by physical vapor deposition or chemical vapor deposition.

The variable resistance patterns VRP may completely or partially fill the expanded recess regions ER. When the variable resistance patterns VRP completely fill the expanded recess regions ER, a planarization process may be performed to allow the variable resistance patterns VRP to have their top surface coplanar with that of the mold dielectric pattern 121 and those of the first and second buried dielectric patterns 151 and 161.

When the variable resistance patterns VRP partially fill the expanded recess regions ER, middle electrodes (see ME of FIG. 5) may be formed on upper portions of the expanded recess regions ER. The middle electrodes ME may be formed by forming an electrode layer on the substrate 100 having the variable resistance patterns VRP formed thereon and then performing a planarization process on the electrode layer. The middle electrodes ME may include one or more of W, Ti, Al, Cu, C, CN, TiN, TiAlN, TiSiN, TiCN, WN, CoSiN, WSiN, TaN, TaCN, and TaSiN.

Referring back to FIGS. 4, 5, and 9, switching elements SW and top electrode TE may be formed on corresponding variable resistance patterns VRP (S80).

For example, a switching layer and a top electrode layer may be sequentially stacked on top surfaces of the variable resistance patterns VRP. A mask pattern may be formed on the top electrode layer, and then used as an etching mask to sequentially etch the top electrode layer and the switching layer. As a result, the switching elements SW and the top electrodes TE may be two-dimensionally spaced apart from each other along the first and second directions D1 and D2.

The switching layer may be formed of a compound in which one or more of Te and Se as chalcogenide elements are combined with one or more of Ge, Sb, Bi, Al, Pb, Sn, Ag, As, S, Si, In, Ti, Ga, and P. The switching layer may further include a thermal stabilization element in addition to the compound.

The top electrode layer may be formed of one or more of W, Ti, Ta, Al, C, CN, TiN, TiAlN, TiSiN, TiCN, WN, CoSiN, WSiN, TaN, TaCN, and TaSiN.

An upper interlayer dielectric layer 170 may be formed between the switching elements SW. The upper interlayer dielectric layer 170 may include carbon. For example, the upper interlayer dielectric layer 170 may include one or more of silicon oxycarbide, silicon oxycarbonitride, and silicon oxynitride. After the formation of the upper interlayer dielectric layer 170 is completed, a planarization process may be performed to expose top surfaces of the top electrodes TE.

Referring again to FIGS. 4, 5, and 9, second conductive lines CL2 may be formed on the top electrodes TE (S90).

The formation of the second conductive lines CL2 may include forming a conductive layer on the top electrodes TE and then etching the conductive layer by using mask patterns (not shown) extending in the second direction D2.

According to example embodiments, a spacer pattern may be formed of a dielectric material doped with impurities, and a first etching process may be performed to simultaneously recess a top surface of a preliminary spacer pattern and a top surface of the preliminary electrode pattern. Accordingly, it may be possible to simplify methods of fabricating variable resistance memory devices.

Furthermore, the first etching process may use an etch recipe having an etch selectivity with respect to a mold dielectric pattern and first and second buried dielectric patterns, and thus the mold dielectric pattern and the first and second buried dielectric patterns may be prevented from damage while a recess region is formed. Therefore, the variable resistance memory devices may increase in electrical reliability.

Although the present invention has been described in connection with example embodiments of the inventive concepts illustrated in the accompanying drawings, it will be understood to those skilled in the art that various changes and modifications may be made without departing from the technical spirit and essential feature of the inventive concepts. It will be apparent to those skilled in the art that various substitution, modifications, and changes may be thereto without departing from the scope and spirit of the inventive concepts.

What is claimed is:

1. A variable resistance memory device, comprising:
a first conductive line extending in a first direction;
a mold dielectric pattern disposed on the first conductive line;
a second conductive line disposed on the mold dielectric pattern and extending in a second direction different from the first direction;
a bottom electrode disposed in the mold dielectric pattern, the bottom electrode comprising:
a bottom portion disposed on the first conductive line; and
a sidewall portion comprising a pair of sidewalls vertically protruding respectively from opposite ends of the bottom portion, the pair of sidewalls being continuously formed with each other and the bottom portion;
a buried dielectric pattern covering the bottom portion and the sidewall portion of the bottom electrode;
a spacer pattern interposed between the buried dielectric pattern and the bottom electrode, the spacer pattern comprising a dielectric material doped with an impurity comprising a metal element; and
a variable resistance pattern interposed between the bottom electrode and the second conductive line, the variable resistance pattern being in contact with the sidewall portion of the bottom electrode.

2. The variable resistance memory device of claim 1, wherein the bottom electrode comprises a conductive material comprising the metal element.

3. The variable resistance memory device of claim 1, wherein the spacer pattern comprises a silicon element, a metal element, and an oxygen element.

4. The variable resistance memory device of claim 1, wherein the dielectric material of the spacer pattern comprises a first semiconductor element, and wherein the metal element of the impurity with which the dielectric material of the spacer pattern is doped is different from the first semiconductor element.

5. The variable resistance memory device of claim 1, wherein the variable resistance pattern comprises a rounded bottom surface in contact with a top surface of the spacer pattern and a top surface of the bottom electrode.

6. The variable resistance memory device of claim 1, wherein the spacer pattern comprises:
   a first segment disposed on the bottom portion of the bottom electrode; and
   a second segment disposed on the sidewall portion of the bottom electrode the second segment being continuously formed with the first segment, and
   wherein the second segment of the spacer pattern is in contact with the variable resistance pattern.

7. The variable resistance memory device of claim 1, wherein, on the first conductive line, a thickness of the bottom electrode is less than a thickness of the spacer pattern.

8. The variable resistance memory device of claim 1, wherein the mold dielectric pattern and the buried dielectric pattern comprise a dielectric material different from the dielectric material of the spacer pattern.

9. The variable resistance memory device of claim 1, wherein the buried dielectric pattern comprises a seam or a void interposed between the pair of sidewalls of the bottom electrode.

10. The variable resistance memory device of claim 1, wherein the dielectric material of the spacer pattern has a high etch selectively with respect to a material of the mold dielectric pattern, and a low etch selectively with respect to a material of the bottom electrode.

11. The variable resistance memory device of claim 1, further comprising a switching element interposed between the variable resistance pattern and the second conductive line,
   wherein the switching element comprises a chalcogenide material.

12. The variable resistance memory device of claim 1, wherein a bottom surface of the buried dielectric pattern is above a top surface of the spacer pattern.

13. A variable resistance memory device, comprising:
   a first conductive line extending in a first direction;
   a mold dielectric pattern formed on the first conductive line;
   a second conductive line formed on the mold dielectric pattern and extending in a second direction different from the first direction;
   a bottom electrode formed in the mold dielectric pattern, the bottom electrode comprising a bottom portion connected to the first conductive line and a sidewall portion vertically protruding from the bottom portion;
   a buried dielectric pattern covering the bottom portion and the sidewall portion of the bottom electrode;
   a spacer pattern formed between the buried dielectric pattern and the bottom electrode, the spacer pattern comprising a dielectric material doped with an impurity; and
   a variable resistance pattern formed between the bottom electrode and the second conductive line, the variable resistance pattern being in contact with the sidewall portion of the bottom electrode,
   wherein the bottom electrode comprises a conductive material comprising a metal element, and
   the impurity doped in the dielectric material of the spacer pattern comprises the metal element.

14. The variable resistance memory device of claim 13, wherein the metal element comprises titanium (Ti).

15. The variable resistance memory device of claim 13, wherein the variable resistance pattern has a first sidewall contacting the mold dielectric pattern and a second sidewall contacting the buried dielectric pattern.

16. The variable resistance memory device of claim 13, wherein the mold dielectric pattern and the buried dielectric pattern comprise a dielectric material different from the dielectric material of the spacer pattern.

* * * * *